United States Patent
Bolkhovitin

(10) Patent No.: US 10,635,529 B2
(45) Date of Patent: Apr. 28, 2020

(54) PARITY OFFLOAD FOR MULTIPLE DATA STORAGE DEVICES

(71) Applicant: Western Digital Technologies, Inc., Irvine, CA (US)

(72) Inventor: Vladislav Bolkhovitin, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 110 days.

(21) Appl. No.: 15/680,112

(22) Filed: Aug. 17, 2017

(65) Prior Publication Data

US 2018/0341547 A1   Nov. 29, 2018

Related U.S. Application Data

(60) Provisional application No. 62/511,326, filed on May 25, 2017.

(51) Int. Cl.
*G06F 11/10* (2006.01)
*G06F 15/173* (2006.01)
(Continued)

(52) U.S. Cl.
CPC ......... *G06F 11/1068* (2013.01); *G06F 3/061* (2013.01); *G06F 3/064* (2013.01);
(Continued)

(58) Field of Classification Search
CPC ........... G06F 11/1068; G06F 15/17331; G06F 3/061; G06F 3/0619; G06F 11/108;
(Continued)

(56) References Cited

U.S. PATENT DOCUMENTS 5,651,132 A * 7/1997 Honda ................. G06F 3/0601
708/531
6,008,987 A   12/1999 Gale et al.
(Continued)

FOREIGN PATENT DOCUMENTS

DE    102005063281    7/2007
EP          2066158    6/2009
(Continued)

OTHER PUBLICATIONS

International Search Report and International Written Opinion of International Patent Application PCT/US2015/016656, dated May 18, 2015, 13 pages.
(Continued)

*Primary Examiner* — Guy J Lamarre
(74) *Attorney, Agent, or Firm* — Morgan, Lewis & Bockius LLP

(57) ABSTRACT

A system and method improve the performance of non-volatile memory storage by offloading parity computations to facilitate high speed data transfers, including direct memory access (DMA) transfers, between a remote host and a non-volatile memory based storage system, such as a flash memory based data storage device (e.g., SSD). In conjunction with writing to non-volatile memory storage, a stripe map is used to target a selected data storage device for parity generation. All data of a stripe is transmitted to the selected data storage device to generate the parity and the generated parity is propagated from the selected data storage device to other data storage devices in the stripe. The data for the stripe may also be propagated from the selected data storage device to the other data storage devices in the stripe.

20 Claims, 16 Drawing Sheets

(51) Int. Cl.
  *G11C 29/52* (2006.01)
  *G06F 13/28* (2006.01)
  *G06F 3/06* (2006.01)
(52) U.S. Cl.
  CPC .......... *G06F 3/0619* (2013.01); *G06F 3/0646* (2013.01); *G06F 3/0665* (2013.01); *G06F 3/0688* (2013.01); *G06F 11/108* (2013.01); *G06F 13/28* (2013.01); *G06F 15/17331* (2013.01); *G11C 29/52* (2013.01); *G06F 3/065* (2013.01)
(58) Field of Classification Search
  CPC ...... G06F 3/0646; G06F 3/065; G06F 3/0665; G06F 3/0688; G06F 13/28; G06F 3/064; G11C 29/52
  See application file for complete search history.

(56) References Cited

U.S. PATENT DOCUMENTS

| | | | |
|---|---|---|---|
| 7,636,814 | B1 | 12/2009 | Karr et al. |
| 9,164,702 | B1 | 10/2015 | Nesbit et al. |
| 10,430,279 | B1* | 10/2019 | Dittia .................... G06F 3/0619 |
| 2008/0236791 | A1 | 10/2008 | Wayman |
| 2011/0208995 | A1 | 8/2011 | Hafner et al. |
| 2011/0302358 | A1 | 12/2011 | Yu et al. |
| 2012/0124312 | A1 | 5/2012 | Vemuri et al. |
| 2012/0170224 | A1 | 7/2012 | Fowler et al. |
| 2013/0067294 | A1 | 3/2013 | Flynn et al. |
| 2015/0095696 | A1* | 4/2015 | Hess .................... G06F 11/108 714/6.24 |
| 2016/0110270 | A1 | 4/2016 | Iwashita |
| 2016/0179637 | A1 | 6/2016 | Winokur |
| 2016/0217049 | A1 | 7/2016 | Bali et al. |
| 2018/0341548 | A1* | 11/2018 | Bolkhovitin ........ G06F 11/1068 |

FOREIGN PATENT DOCUMENTS

| | | |
|---|---|---|
| EP | 2395827 | 12/2011 |
| FR | 2560731 | 9/1985 |
| JP | H066064 | 1/1994 |

OTHER PUBLICATIONS

International Search Report and Written Opinion dated Nov. 22, 2017 received in International Patent Application No. PCT/US2017/050194, which corresponds to U.S. Appl. No. 15/491,915, 14 pages (Van Assche).

International Patent Application No. PCT/US2018/021787, International Search Report and the Written Opinion of the International Searching Authority, dated Jun. 5, 2018, 14 pages.

* cited by examiner

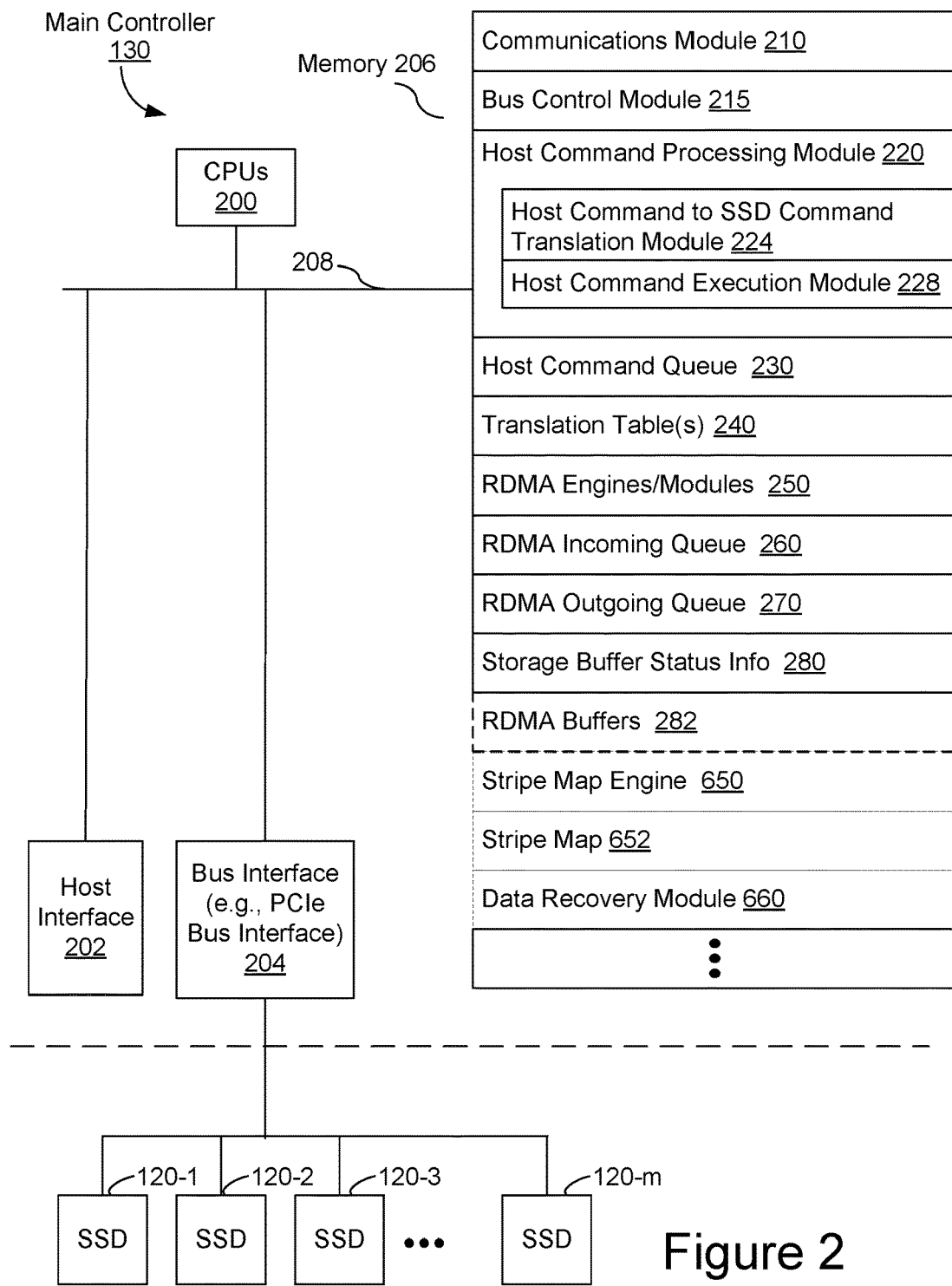
Figure 2
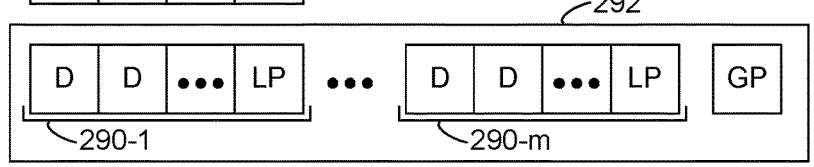

PARITY OFFLOAD FOR MULTIPLE DATA STORAGE DEVICES

RELATED APPLICATIONS

This application claims priority to U.S. Provisional Patent Application 62/511,326, filed on May 25, 2017, which is hereby incorporated by reference in its entirety.

TECHNICAL FIELD

The disclosed embodiments relate generally to memory systems, and in particular, to generating parity for data to be stored on multiple non-volatile data storage device (e.g., solid state drives).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. When non-volatile memory systems are implemented in storage networks, such as disaggregated storage networks, central processing unit (CPU) systems are situated between network connected hosts and non-volatile memory to facilitate storage. The CPU systems receive and buffer data in memory, such as DRAM memory, while the data is routed between the network host and the non-volatile memory storage for reading or writing data. The CPU systems and their associated buffers, however, have not been keeping up with the speeds of networks and non-volatile memory storage and have become a bottleneck.

One aspect of the performance bottleneck is computing parity for data written to data storage systems, such as solid state drive systems. If parity is generated in a host or in intermediate CPU systems situated between network connected hosts and non-volatile memory, the parity computation becomes a further bottleneck for high-performance writes. Therefore, it would be desirable to avoid having to perform parity computations on the host(s) or intermediate CPU systems situated between network connected hosts and non-volatile memory.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description," one will understand how the aspects of various embodiments are used to enable higher throughput in storage to memory devices.

The disclosed system and method improve the performance of non-volatile memory storage by offloading parity computations to non-volatile memory based data storage systems, such as a flash memory based solid state drive (SSD). In response to a request, from a host system, to write specified data in a non-volatile memory system having a main controller and a plurality of data storage devices, the main controller performs a sequence of operations, including identifying a Redundancy Coding stripe in the plurality of data storage devices to which to write the specified data, the Redundancy Coding stripe including storage locations in a set of three of more data storage devices in the system, identifying a first data storage device in the Redundancy Coding stripe to which to write the specified data, and identifying a second data storage device in the Redundancy Coding stripe at which to compute and store parity information for the Redundancy Coding stripe. The sequence of operations further includes initiating a data transfer of the specified data to the identified second data storage device, and sending a parity computation command so the identified second data storage device. The storage system can implement a number of variations in terms of how the specified data is transmitted to the first data storage device in which the specified data is to be stored, how the specified data is transmitted to the second data storage device in which the parity computation is performed, transmittal of computed parity information from the second data storage device to a third data storage device in some embodiments, and the use of overlapping Redundancy Coding stripes in some embodiments.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 2 is a block diagram illustrating an implementation of a controller, in accordance with some embodiments.

FIG. 2A shows an example of a Redundancy Coding stripe having one or more parity data storage devices (e.g., SSDs), while FIG. 2B shows an example of a Redundancy Coding stripe having two or more mini-stripes, each mini-stripe having multiple data storage devices and one or more local parity data storage devices, and a global parity data storage device.

Figure 1A:
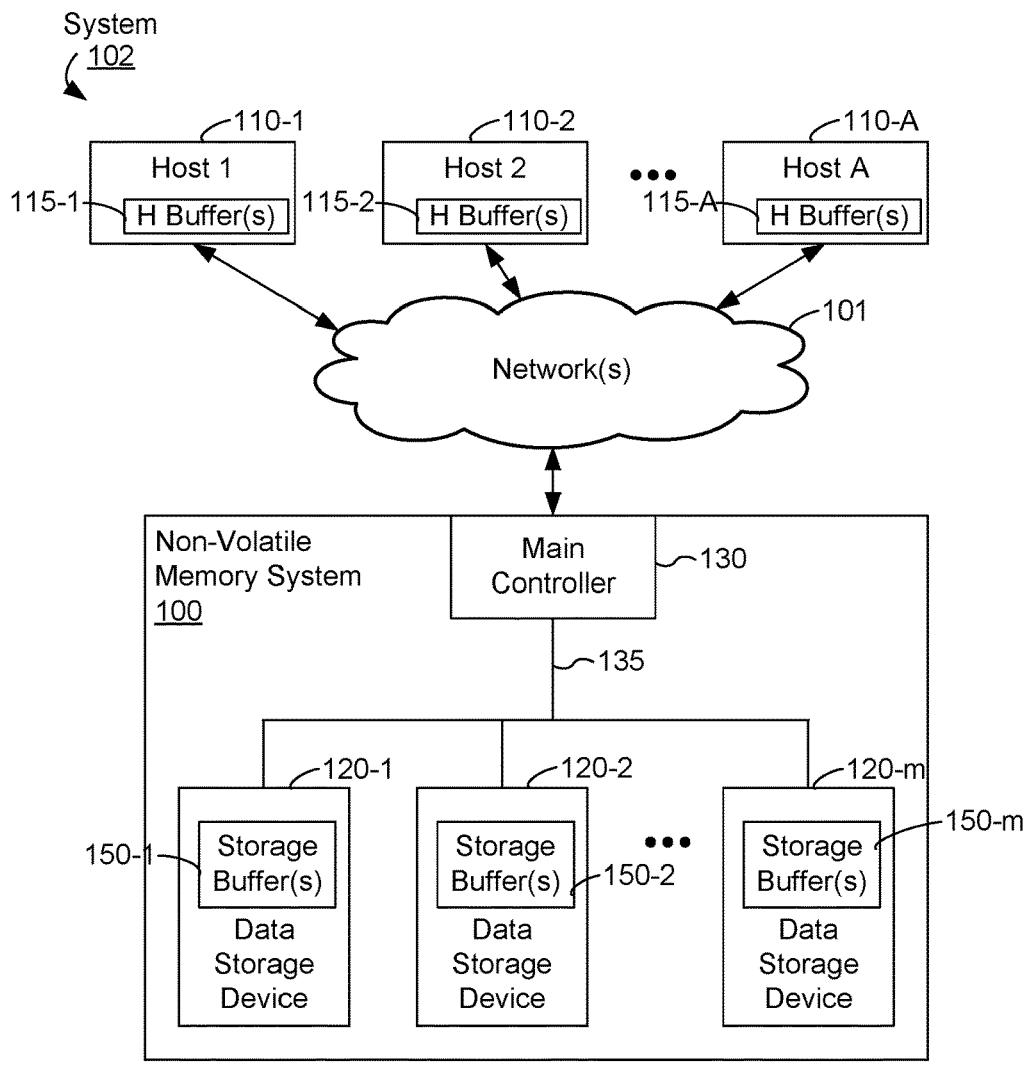
FIG. 1A is a block diagram illustrating a distributed computing system that includes an implementation of a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable adaptive verify voltage adjustment in memory devices. Some implementations include systems, methods and/or devices to enable higher throughput in storage to memory devices.

(A1) More specifically, some embodiments include a method of processing memory access in a non-volatile memory system having a main controller and a plurality of data storage devices. The method includes at the main controller, receiving, from a host device external to the non-volatile memory system, a write request to write specified data. In response to receiving the write request, the main controller performs a sequence of operations, including: identifying a Redundancy Coding stripe in the plurality of data storage devices to which to write the specified data, the Redundancy Coding stripe including storage locations in a set of data storage devices comprising three of more of the plurality of data storage devices; identifying a first data storage device in the set of data storage devices to which to write the specified data, the identified data storage device including a controller, non-volatile memory and a data buffer; identifying a second data storage device in the set of data storage devices at which to compute and store parity for the identified Redundancy Coding parity stripe; initiating a data transfer of the specified data from a memory location in the host device, specified by the write request, to the second data storage device; and sending a parity computation command to the second data storage device to perform a parity computation on the specified data transferred to the second data storage device.

(A2) In some embodiments of the method of A1, the sequence of operations includes performing a multicast data transfer to concurrently transfer the specified data to both the first data storage device and the second data storage device.

(A3) In some embodiments of the method of A2, the sequence of operations includes: allocating buffer space in the first data storage device to receive the specified data; allocating buffer space in the second data storage device to receive the specified data; and initiating execution of a remote direct memory access (RDMA) data transfer of the specified data from a memory location in the host device to the allocated buffer space in the first data storage device and to the allocated buffer space in the second data storage device.

(A4) In some embodiments of the method of A1, after completion of the data transfer of the specified data from the host device to the second data storage device, a copy of the specified data is transmitted from the second data storage device to the first data storage device, and the specified data is stored in storage locations of the first data storage device in the identified Redundancy Coding stripe.

(A5) In some embodiments of the method of A1 or A4, the sequence of operations includes: allocating buffer space in the second data storage device to receive the specified data; and initiating execution of a remote direct memory access (RDMA) data transfer of the specified data from a memory location in the host device to the allocated buffer space in the second data storage device.

(A6) In some embodiments of the method of any of A1 to A5, the second data storage device generates parity values for data stored in storage locations in the identified Redundancy Coding stripe that are located in a plurality of data storage devices of the set of data storage devices, and stores the generated parity values in storage locations in the identified Redundancy Coding stripe that are located in the second data storage device.

(A7) In some embodiments of the method of A5, a copy of the generated parity values is transmitted from the second data storage device to a third data storage device in the set of data storage devices, and the generated parity values are stored in storage locations in the identified Redundancy Coding stripe that are located in the third data storage device.

(A8) In some embodiments of the method of A1, the sequence of operations includes sending a Redundancy Coding stripe map to the second data storage device, the Redundancy Coding stripe map indicating which data storage devices of the plurality of data storage devices are included in the set of data storage devices.

(A9) In some embodiments of the method of any of A1 to A8, the write request is a first write request, the specified data is first specified data, the host device is a first host device, the Redundancy Coding stripe is a first Redundancy Coding stripe and the set of data storage devices is a first set of data storage devices, and the method further includes: receiving, from a second host device external to the non-volatile memory system, a second write request to write second specified data; in response to receiving the second write request, performing a sequence of operations, including: identifying a second Redundancy Coding stripe in the plurality of data storage devices to which to write the second specified data, the second Redundancy Coding stripe including storage locations in a second set of data storage devices comprising three of more of the plurality of data storage devices; wherein the second set of data storage devices at least partially overlaps the first set of data storage devices; identifying a third data storage device in the second set of data storage devices to which to write the second specified data, the identified data storage device including a controller, non-volatile memory and a data buffer; identifying a fourth data storage device in the set of data storage devices at which to compute and store parity for the second Redundancy Coding parity stripe; initiating a data transfer of the second specified data from a memory location in the second host device, specified by the second write request, to the fourth data storage device; and sending a parity computation command to the fourth data storage device to perform a parity computation on the second specified data transferred to the fourth data storage device.

(A10) In some embodiments of the method of A9, the fourth data storage device is distinct from the second data storage device and is included in both the first set of data storage devices and the second set of data storage devices.

(A11) In some embodiments of the method of any of A9-A10, the second data storage device is identified in accordance with application of a mapping function to a logical address specified by the first write request, and the fourth data storage device is identifying in accordance with application of the mapping function to a logical address specified by the second write request.

(A12) In some embodiments of the method of A11, the first set of data storage devices is identified in accordance with application of a mapping function to a logical address specified by the first write request, and the second set of data storage devices is identified in accordance with application of the mapping function to a logical address specified by the second write request.

(A13) In some embodiments, a memory controller, comprises a storage interface, a host interface and a write request processing module. The storage interface couples the memory controller to a plurality of data storage devices. The host interface receives, from one or more host devices external to the memory controller, write requests and read requests, each write request comprising a request to write specified data from a respective host device to a respective data storage device, and each read request comprising a request to read requested data from a respective data storage device and convey the read data to a respective host device. The write command processing module processes a respective write request from a respective host device by performing a sequence of operations, including: identifying a Redundancy Coding stripe in the plurality of data storage devices to which to write the specified data, the Redundancy Coding stripe including storage locations in a set of data storage devices comprising three of more of the plurality of data storage devices; identifying a first data storage device in the set of data storage devices to which to write the specified data, the identified data storage device including a controller, non-volatile memory and a data buffer; identifying a second data storage device in the set of data storage devices at which to compute and store parity for the identified Redundancy Coding stripe; initiating a data transfer of the specified data from a memory location in the host device, specified by the write request, to the second data storage device; and sending a parity computation command to the second data storage device to perform a parity computation on the specified data transferred to the second data storage device.

(A14) In some embodiments of the memory controller of A13, each data storage device of the plurality of data storage devices in the non-volatile memory system includes non-volatile memory for durably storing information, one or more data buffers for temporarily storing information being written to or read from the non-volatile memory of the data storage device, and a storage controller for controlling operation of the data storage device, including execution of read and write commands.

(A15) In some embodiments of the memory controller of A12 or A13, the memory controller is configured to perform and/or initiate the performance of the method of any of A3 to A12.

(A16) In some embodiments, a non-transitory computer readable storage medium stores one or more programs configured for execution by a memory controller configured to be coupled to one or more host devices and a plurality of data storage devices. The one or more programs include instructions that when executed by one or more processors of the memory controller, cause the memory controller to perform and/or initiate the performance of the method of any of A1 to A12.

Numerous details are described herein to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

Even though solid state drives are but one example of the data storage devices discussed in this document, in several of the figures, data storage devices 120 are labeled "SSD" and storage buffers 150 are labeled "SSD buffer 150" or "buffer 150" to conserve space.

FIG. 1A is a block diagram illustrating a distributed system 102 that includes an implementation of a non-volatile memory system 100, coupled over a network 101 to a plurality of host systems 110 (sometimes called host computer systems, host devices, or hosts) in accordance with some embodiments. In some embodiments, non-volatile memory system 100 includes a non-volatile data storage device 120 (also sometimes called an information storage device, or a storage device, or a memory device). Data storage device 120 may include a single flash memory device, or a plurality of flash memory devices that are NAND-type flash memory or NOR-type flash memory. In some embodiments, data storage device 120 includes one or more three-dimensional (3D) non-volatile memory devices. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, non-volatile memory system 100 (sometimes called a data storage system) includes one or more non-volatile data storage devices 120.

In FIG. 1A, host systems 110 are coupled to a main storage controller 130 of non-volatile storage system 100 through network 101. However, in some embodiments a respective host system 110 includes a storage controller, or a portion of main storage controller 130, as a component and/or as a subsystem. For example, in some embodiments, some or all of the functionality of storage controller 130 is implemented by software or hardware within at least one of the host systems 110. A respective host computer system 110 may be any suitable computer device, such as a computer, a laptop computer, a tablet device, a netbook, an internet kiosk, a personal digital assistant, a mobile phone, a smart phone, a gaming device, a computer server, or any other computing device. Each host computer system 110 is sometimes called a host, host system, client, or client system. In some embodiments, a respective host computer system 110 is a server system, such as a server system in a data center. In some embodiments, a respective host computer system 110 includes one or more processors, one or more types of memory, a display and/or other user interface components such as a keyboard, a touch-screen display, a mouse, a track-pad, a digital camera, and/or any number of supplemental I/O devices to add functionality to host computer system 110. In some embodiments, host computer system 110 does not have a display and other user interface components.

Within the illustrative non-volatile memory system 100, a main controller 130 is coupled to network 101 and to one or more data storage devices 120 through connections 135. Main controller 130 is a controller for controlling access to data storage devices 120 and bi-directional processing of read and write commands and associated data between networked host systems 110 and data storage devices 120, such as solid state disk drives (SSDs). The controller may be a non-volatile memory express (NVMe) controller, a Redundancy Coding controller (e.g., a redundant array of independent disks (RAID) controller), or as described in further detail below another type of CPU or processor for controlling access to non-volatile storage devices. Network 101 and connections 135 are sometimes called data connections, but typically convey commands in addition to data, and optionally convey metadata, error correction information and/or other information in addition to data values to be stored in data storage devices 120 and data values read from data storage devices 120. In some embodiments, however, controller 130 and data storage devices 120 are included in the same device (i.e., an integrated device) as components thereof. Furthermore, in some embodiments, data storage devices 120 are embedded in a host device (e.g., computer system 110), such as a mobile device, tablet, other computer or computer controlled device, and the methods described herein are performed, at least in part, by the embedded storage controller.

In some embodiments, data storage devices 120 include any number (i.e., one or more) of memory devices including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Data storage devices 120 further include buffers 150 (sometimes called storage buffers) that may be allocated by the main controller 130 as part of its directly accessible memory space for use when writing data to or reading data from data storage devices 120 using remote DMA operations. Similarly, a host system 110 may include a host buffer 115 that is directly accessible by the main controller 130 during remote DMA operations.

Figure 3:
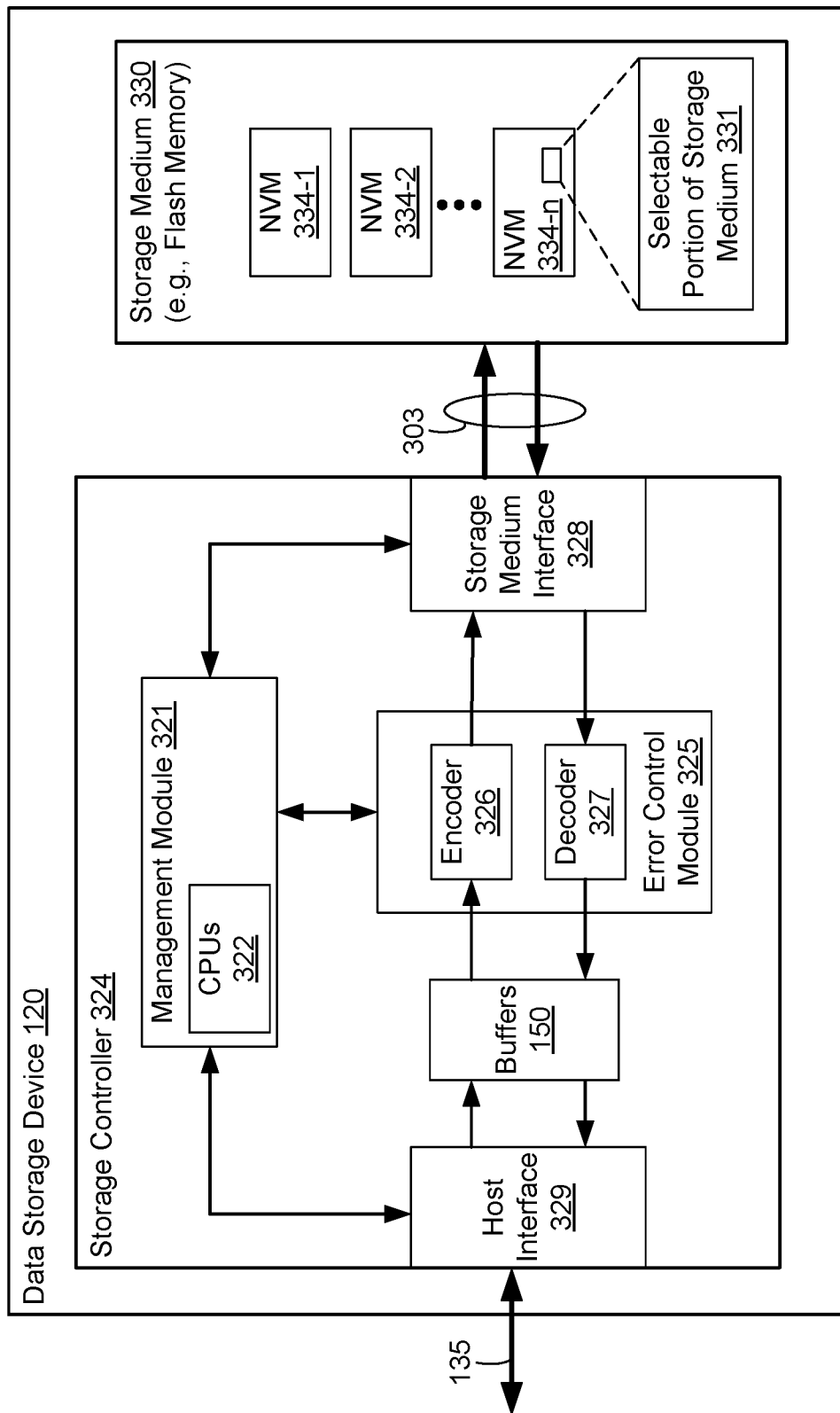
FIG. 3 is a block diagram of a data storage device that is part of a non-volatile memory system, in accordance with some embodiments.

Referring to FIG. 3, each data storage device 120 includes a storage controller 324 (e.g., a solid state drive controller, sometimes called an SSD controller) and a storage medium 330. Storage medium 330 includes memory devices (e.g., NVM 334-1, NVM 334-2, etc.), each of which include addressable and individually selectable blocks. Storage medium 330 includes individually selectable portions 331 (also referred to herein as a selected portion 331). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 324 includes a management module 321, a host interface 329, storage buffers 150, an error control module 325 and a storage medium interface 328. Storage controller 324 may include various additional features that have not been illustrated for the sake of brevity and so as not to obscure pertinent features of the example embodiments disclosed herein, and a different arrangement of features may be possible. Host interface 329 provides an interface to the data storage device 120 through data connections 135. Similarly, storage medium interface 328 provides an interface to storage medium 330 though connections 303. In some embodiments, storage medium interface 328 includes read and write circuitry, including circuitry capable of providing reading signals to storage medium 330 (e.g., reading threshold voltages for NAND-type flash memory).

In some embodiments, storage buffers 150 are implemented using non-volatile random access memory (sometimes called non-volatile RAM or NVRAM), such as battery-backed dynamic random access memory (DRAM). At least some of the storage buffers 150 may be directly accessible to not only the memory management module 321, but also the main controller 130 (FIG. 1A) via data connections 135, which may be any suitable bus or network, and may use any suitable protocol, such as SATA or PCI express. In some embodiments, storage buffers 150 are allocated by the main controller 130 and the data storage device 120 to facilitate remote DMA operations between a host 110 and a data storage device 120.

In some embodiments, management module 321 includes one or more processing units 322 (sometimes herein called CPUs, processors, or hardware processors, and sometimes implemented using microprocessors, microcontrollers, or the like) configured to execute instructions in one or more programs (e.g., in management module 321). In some embodiments, the one or more CPUs 322 are shared by one or more components within, and in some cases, beyond the function of storage controller 324. However, in some embodiments, management module 321 does not include any CPUs or processors that execute instructions in one or more programs, and instead includes an application specific integrated circuit (ASIC) or field programmable gate array (FPGA) that implements one or more state machines to perform the functions of management module 321.

Management module 321 is coupled to host interface 329, error control module 325 and storage medium interface 328 in order to coordinate the operation of these components. In some embodiments, one or more modules of management module 321 are implemented by a host computer system 110. Management module 321 is coupled to storage medium 330, via storage medium interface 328, in order to manage the operation of storage medium 330.

Error control module 325 is coupled to storage medium interface 328, storage buffers 150, and management module 321. Error control module 325 is provided to limit the number of uncorrectable errors inadvertently introduced into data during writes to memory or reads from memory. In some embodiments, error control module 325 is executed in software by the one or more CPUs 322 of management module 321, and, in other embodiments, error control module 325 is implemented in whole or in part using special purpose circuitry to perform data encoding and decoding functions. To that end, error control module 325 includes an encoder 326 and a decoder 327. Encoder 326 encodes data by applying an error control code to produce a codeword, which is subsequently stored in storage medium 330.

When the encoded data (e.g., one or more codewords) is read from storage medium 330, decoder 327 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, a respective buffer 150 (sometimes called an input buffer or allocated buffer) receives data to be stored in storage medium 330 from computer system 110 via a remote DMA operation that is controlled by main controller 130 of memory system 100. The data held in the allocated buffer 150 is made available to encoder 326, which encodes the data to produce one or more codewords. The one or more codewords are made available to storage medium interface 328, which transfers the one or more codewords to storage medium 330 in a manner dependent on the type of storage medium being utilized. To initiate the write, the memory management module 321 receives from the main controller 130 a translated write command, which includes information sufficient to transfer the data to be written from the allocated buffer 150 to a location in the storage medium 330. In some embodiments, memory management module 321 includes completion logic that notifies main controller 130 when the data associated with the command has been written from to the allocated buffer 150.

A read operation is initiated when a respective host computer system 110 sends one or more host read commands (e.g., via network 101) to the main storage controller 130, which translates the command and sends the translated command to the storage controller 324 of a respective data storage device 120 (see FIG. 1A), requesting data from storage medium 330. Storage controller 324 sends one or more read access commands to storage medium 330, via storage medium interface 328, to transfer raw read data in accordance with memory locations (addresses) specified by the one or more host read commands. Storage medium interface 328 provides the raw read data (e.g., comprising one or more codewords) to decoder 327. If the decoding is successful, the decoded data is provided to an output buffer 150 allocated by the main controller 130, where the decoded data is made available to computer system 110 via a remote DMA operation using the main controller 130. In some embodiments, if the decoding is not successful, storage controller 324 may resort to a number of remedial actions or provide an indication of an irresolvable error condition. The memory management module 321 may further include completion logic that notifies the main controller 130 when the data associated with the command is in the allocated buffer 150 and ready to be sent directly to the host via RDMA.

Figure 1B:
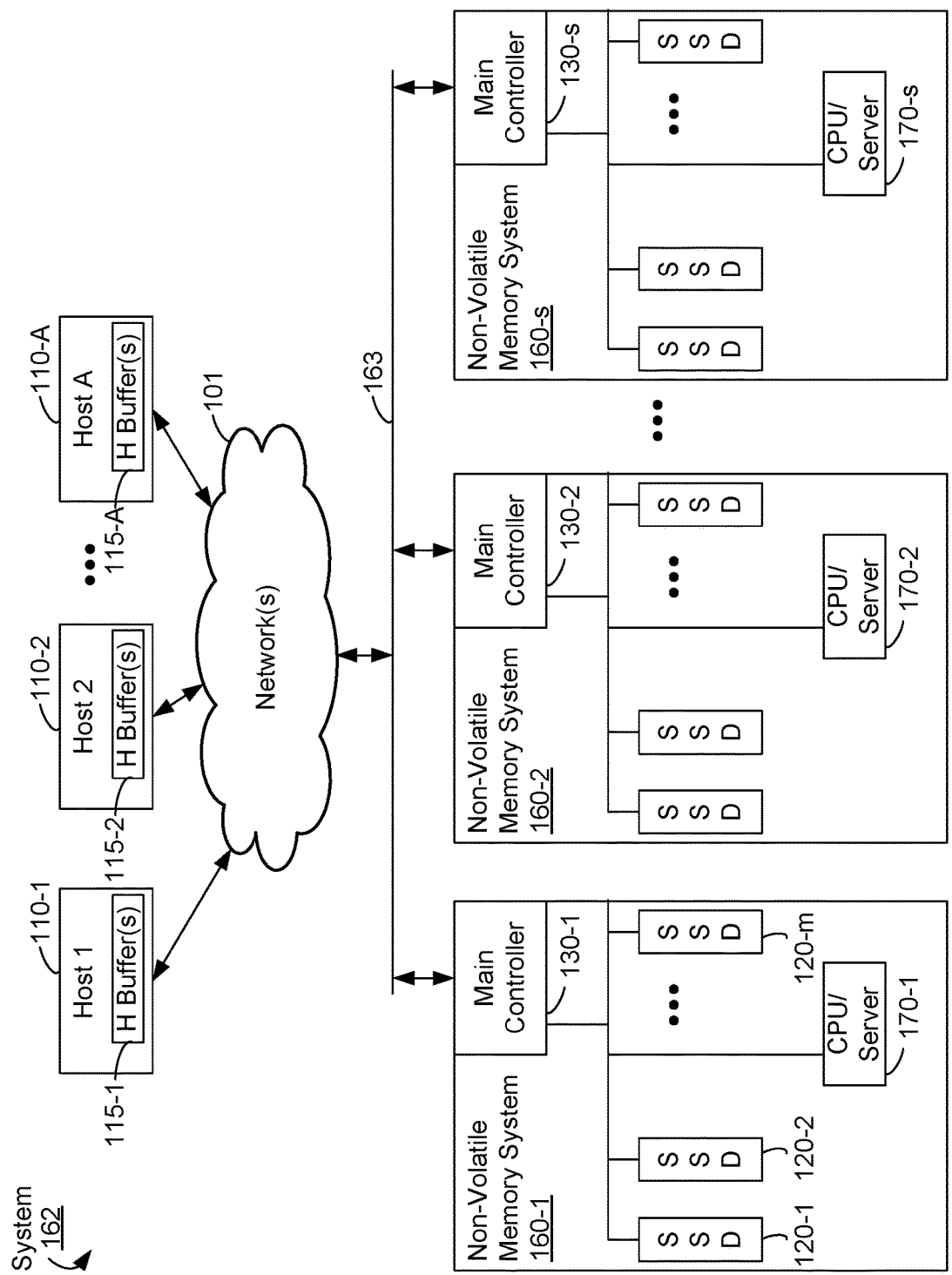
FIG. 1B is a block diagram illustrating a distributed computing system that includes one or non-volatile memory systems that include a compute engine or server, in accordance with some embodiments.

FIG. 1B is a block diagram illustrating a distributed computing system 162 that is similar to distributed system 102 (FIG. 1A). However, system 162 includes one or more non-volatile memory systems 160 that each include a compute engine or server 170, in accordance with some embodiments. Those aspects of system 162 that are the same or similar to system 102, FIG. 1A, have the same reference numbers, and to the extent they are the same as in system 102, will not be discussed again, to avoid needless repetition. As shown in FIG. 1B, system 162 includes two or more non-volatile memory systems 160 (e.g., NVM systems 160-1, 160-2 to 160-s, where s is an integer greater than 1), which are sometimes collectively called storage system 180. In some embodiments, system 162 includes at least one, and in some embodiments, system at least two NVM systems 160 that each include an internal compute engine or server 170. In FIG. 1B, NVM systems 160 are shown as being interconnected by a network or communication bus 163. Functionally, and for purposes of the explanations that follow, network or communication bus 163 is included in network(s) 101. However, in some embodiments, network of communication bus 163 is separate from network(s) 101, and instead is part of storage system 180 instead of network(s) 101.

In some such embodiments, the compute engine/server 170 (e.g., 170-1, 170-2 or 170-s) of the respective NVM system 160 is a compute engine that includes a hardware processor (e.g., a microprocessor, ASIC, state machine, or the like) and working memory (e.g., DRAM, SRAM, or other random access memory), for executing programs sent to it by one or more of hosts 110, herein called the requesting host for ease of explanation. For example, such program may be used to perform data intensive tasks, such as data mining, data analysis, report generation, etc., and to then send the results of those tasks back to the requesting host. In this way, large quantities of data needed for the data intensive tasks need not be transported across network(s) 101 to the requesting host, and instead only the programs and results are transported across network(s) 101.

In some other embodiments, the compute engine/server 170 is a server that includes a hardware processor (e.g., a microprocessor, ASIC, or the like) and working memory (e.g., DRAM, SRAM, or other random access memory), for executing programs, hosting applications, and providing services to client systems (e.g., any of hosts 110, as well as other client systems not shown in FIG. 1B). Thus, each NVM system 160 in such embodiments is an integrated host/server and storage system. In some such embodiments, host systems 110 are embedded in NVM systems 160, implemented using compute engines/servers 170. In some such embodiments, communication bus 163 effectively replaces network 101 for communications between the host systems/servers 170.

In both types of embodiments described above, compute engine/server 170 accesses information in the data storage devices (e.g., SSDs) of its NVM system 160 directly, using standard SSD access protocols, without going through main controller 130. However, to the extent it needs to access information stored in any of the data storage devices 120 of any of the other NVM systems 160, it is functionally the same as a host 110, conveying its request(s) to the other NVM system 160 via network(s) 101 (which includes network/communication bus 163, as explained above), and the main controller 130 of that NVM system 160.

FIG. 2 is a block diagram illustrating an implementation of a main controller 130, in accordance with some embodiments. In some embodiments, main controller 130 includes one or more processors 200, sometimes called CPUs, or hardware processors, or microcontrollers; host interface 202 for coupling main controller 130 to one or more host systems 110 (FIG. 1A); bus interface 204 for coupling main controller to one or more communication busses (e.g., connections 135, FIG. 1A); memory 206 (sometimes herein called controller memory); and one or more communication buses 208 for interconnecting these components. Communication buses 208 optionally include circuitry (sometimes called a chipset) that interconnects and controls communications between system components.

Main controller 130 generally facilitates getting data into and out of non-volatile memory in data storage devices 120. Main controller 130 exchanges data over network 101 with host systems 110 via host interface 202. In some embodiments, main controller 130 may be a Redundancy Coding controller (e.g., a RAID controller) for storing and accessing data in an array of data storage devices (e.g., data storage devices 120). The one or more processors 200 execute modules, programs and/or instructions stored in memory 206 and thereby perform processing operations. In some embodiments, the one or more processors 200 are coupled to data storage devices 120 by communication buses 208. In other embodiments the coupling is indirect through, for example, bus interface 204, such as a PCI express bus interface. Other bus interfaces, including a SATA bus interface may also be used.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 200. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- communications module 210 used for communicating with other components, such as data storage devices 120, and host computer systems 110;
- a bus control module 215 used for executing bus protocols and transferring data over busses between components;
- a host command processing module 220 that receives read and write commands from host systems 110, allocates storage buffers 150 in data storage devices, and translates the host commands into data storage device commands to facilitate remote DMA transfers of data corresponding to the read and write commands between host buffers on host systems 110 and storage buffers 150 on associated data storage devices 120. To facilitate the translation of host commands, host command processing module 220 may include a host command to data storage device command (e.g., SSD command) translation module 224, which converts host write and read commands into commands suitable for execution by data storage device 120, and optionally facilitates virtualizing addresses embedded in the host commands. Host command processing module 220 may further include a host command execution module 228 that facilitates executing received host commands, for example by setting up and executing remote DMA data transfers, and sending translated data storage device commands to respective data storage devices 120 for execution.
- One or more host command queues 230, used to track commands received from hosts 110 and their associated translated commands;
- Translation tables 240, used in some embodiments to translate addresses or name spaces in the received host commands into data storage device identifiers or data storage device addresses;
- RDMA engines 250, used in some embodiments to transfer data between a host buffer and one or more allocated storage buffers 150 associated with one or more data storage devices 120. The RDMA engines 250 in some embodiments use translated commands, addresses and/or buffer pointers associated with translated commands to accomplish remote direct memory access (RDMA) operations; each RDMA engine 250, once configured with pointers to host and storage device buffers and a counter or other indicator of the quantity of data to be transferred, transfers data between designated host buffers and storage buffers 150 independently of the one or more processors 200;
- RDMA incoming queue 260 and RDMA outgoing queue 270. To facilitate RDMA operations, host command processing module 220 and RDMA engines 250 may use RDMA incoming queue 260 and RDMA outgoing queue 270 to keep track of read operations and write operations that have not yet completed, in accordance with some embodiments; and
- Storage device buffer status information table or data structure 280. To facilitate the allocation of storage buffers 150 in data storage device 120, host command processing module 220 uses a storage device buffer status information table or data structure 280 to keep track of which storage buffers 150 have been allocated and which are available for allocation, in accordance with some embodiments.

In some embodiments, memory 206 of main controller 130 also includes one or more RDMA buffers 282, for temporarily storing data or information being transferred between a host and a data storage device, as discussed below.

Optionally, memory 206 of main controller 130 further includes stripe map engine 650 for determining the non-volatile data storage devices 120 in which to store data and parity information for any given write command or set of write commands, for example when using a particular Redundancy Coding level (e.g., any predefined RAID level such as RAID0 to RAID6, RAID10, RAID01, and so on). In some embodiments, stripe map engine 650 works in conjunction with a stripe map 652 or stripe function for determining the particular data storage devices in which to store data and parity when performing any specified write operation or set of write operations. In some embodiments, main controller 130, when sending a parity generation command to a particular data storage device 120, to generate parity data for specified data, also provides to that data storage device a stripe map or other data structure so that the data storage device knows which other data storage device to forward the specified data to for storage.

In some embodiments, memory 206 of memory controller 130 further includes a data recovery module 660, for recovering data when a data storage device fails or more generally when the data in a portion of a stripe cannot be read from the information stored in the data storage device(s) storing that portion of the stripe.

Each of the above identified elements may be stored in one or more of the previously mentioned memory devices that together form memory 206, and corresponds to a set of instructions and data for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 5A-5D.

Although FIG. 2 shows a main controller 130, FIG. 2 is intended more as a functional description of the various features which may be present in a main controller, or non-volatile memory controller, than as a structural schematic of the embodiments described herein. In practice, and as recognized by those of ordinary skill in the art, items shown separately could be combined and some items could be separated. Further, as noted above, in some embodiments, one or more modules of main controller 130 are implemented by one or more modules of host computer system 110.

In some embodiments, main controller 130 is implemented, at least in part, as a respective data storage device 120 (of the plurality of data storage devices in the storage system 102 or 162), to which has been added the host command processing module 220, host command queue 230, RDMA features 250, 260, 270, 282, and other modules and data structures shown in FIG. 2 for processing host commands. In some of those embodiments, the respective data storage device 120 implementing main controller 130 is also a target for host read requests to read data from that data storage device and host write requests to write data to that data storage device.

Figure 4A:
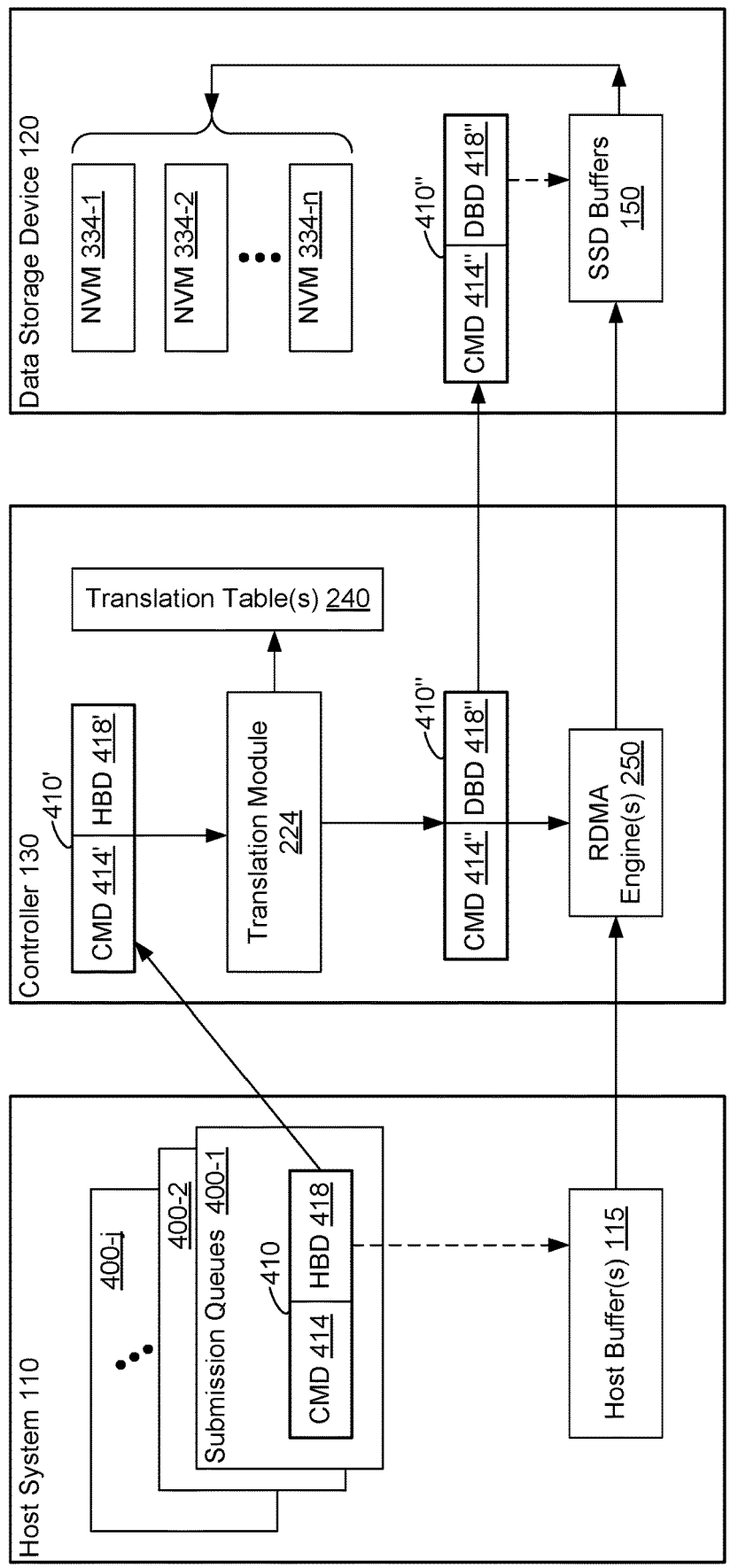
FIG. 4A is a diagram showing some elements of a host system, controller, and data storage device that participate in a remote direct memory access write, in accordance with some embodiments.

FIG. 4A is an illustrative view of several components involved when a host system 110 is writing data to a data storage device 120 according to some embodiments. Referring to FIG. 4A, an illustrative host system 110 includes submission queues 400 that hold commands 410, including read and write commands. When the command 410 is a write command, it includes a command portion 414, and an address portion identifying where the data, sometimes called the write data, residing on the host corresponding to the write command 410 is located. In some embodiments, the write command 410 includes, in addition to command portion 414, a host buffer descriptor 418 that identifies a host buffer 115, or the location of a host buffer 115 that contains the write data to be written to one or more data storage devices 120. Optionally, the command portion 414 includes an address or a logical block address which is sufficient to identify a data storage device 120 to which the write data is to be written. The address information within command 414 may be virtualized or serialized at the host system 110 or main controller 130 after main controller 130 receives the command 410. For example, main controller 130 may perform storage virtualization, index traversing or TLB-based caching, for instance, on the addresses within the command resulting in a modified command 410'.

Main controller 130 is coupled to host system 110 and receives commands 410 (or 410') from the host system to process read and write requests. When a write command 410 is received by main controller 130, main controller 130 may keep the command as is or may modify the command 410 to command 410', as discussed above to virtualize or serialize, for example, certain addresses and/or pointers. After a command 410' has been received and processed, main controller 130 translates the command 410' into command 410". During this translation, the host buffer descriptor ("HBD") 418' is modified to a device buffer descriptor ("DBD") (418"). In some embodiments, the DBD 418" corresponds to an allocated storage buffer 150, which is allocated by main controller 130 and/or the data storage device 120 as part of the process of translating the command. Alternatively, the DBD 418" may point to part of a storage buffer 150 that has already been allocated as part of the operation of main controller 130 and one or more data storage devices 120. The allocated storage buffer 150 corresponding to DBD 418" has an address range that is addressable by the RDMA Engine(s) 250 within main controller 130.

Main controller 130 is further coupled to data storage devices 120. During a write operation, after a host command is received and translated, and a storage buffer 150 is allocated, main controller 130 performs a direct transfer of data from the Host Buffer 115 to the allocated storage buffer 150 using RDMA. This is possible because both the Host Buffer 115 and the allocated storage buffer 150 are within the directly accessible address space of the controller 130. The translated command 410" is provided to the data storage device 120, with the buffer descriptor now pointing to the storage buffer 150. The translated command 410" is typically provided to the data storage device 120 after the data transfer is completed, but optionally could be provided before or during the data transfer, so long as the data storage device 120 is configured to defer execution of the translated command 410" until after the data transfer is completed. Because the allocated storage buffer 150 is within the direct memory address space of the data storage device 120, the translated command 410" may be executed to directly write data from the storage buffer 150 into the non-volatile memory media of (or associated with) data storage device 120.

While this example has been described with respect to interactions between a memory controller 130 and a single data storage device 120, it will be understood that a command may specify writing data into multiple storage devices, and that in such cases storage buffers 150 corresponding to such other storage devices would be allocated on those data storage devices and translated commands would be transferred to those data storage device to accomplish storing the data into the storage media of those data storage devices 120. The data storage devices may further communicate command completion information (not shown in this figure) that is propagated back through the controller to the host system 110 so that the host system 110 knows when the data has been stored into the data storage device(s) 120.

The write command described above is one that specifies a memory location on the host 110 for data that is to be written into a data storage device 120. Alternatively, the data to be written may be included in the command as part of a write immediate command. This is shown in FIG. 4C. In this case, the command includes data 428 instead of a host buffer descriptor 418. After the write immediate command 410 is received, a storage buffer 150 is allocated, and the immediate data 428 is directly written into the allocated storage buffer 150 specified by the DBD 418" in the translated command 410". Subsequently, when the translated command 410" is sent to the data storage device 120, the data is then written from the storage buffer 150 into a data storage device's storage medium.

Figure 4B:
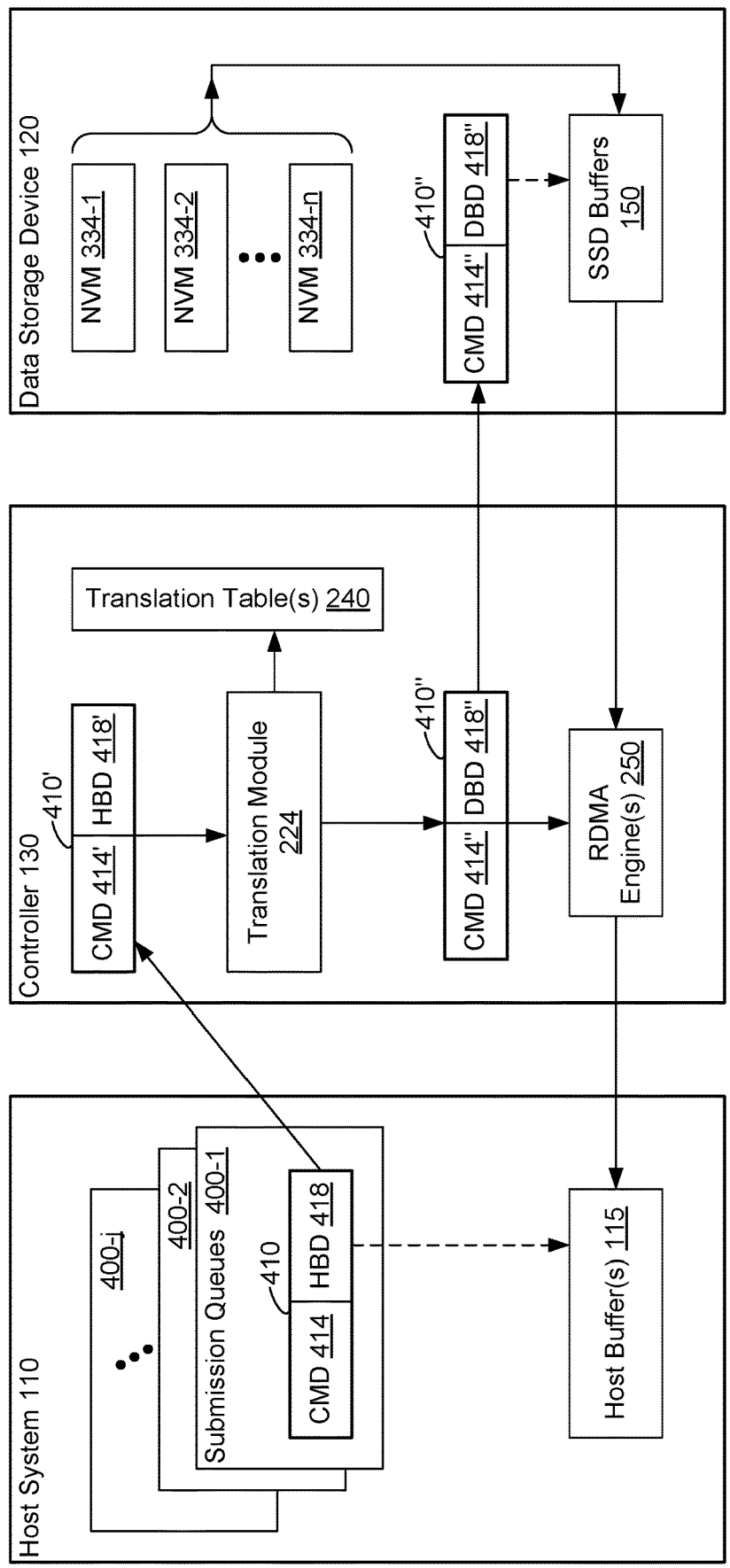
FIG. 4B is a diagram showing some elements of a host system, controller, and data storage device that participate in a remote direct memory access read, in accordance with some embodiments.
Figure 4C:
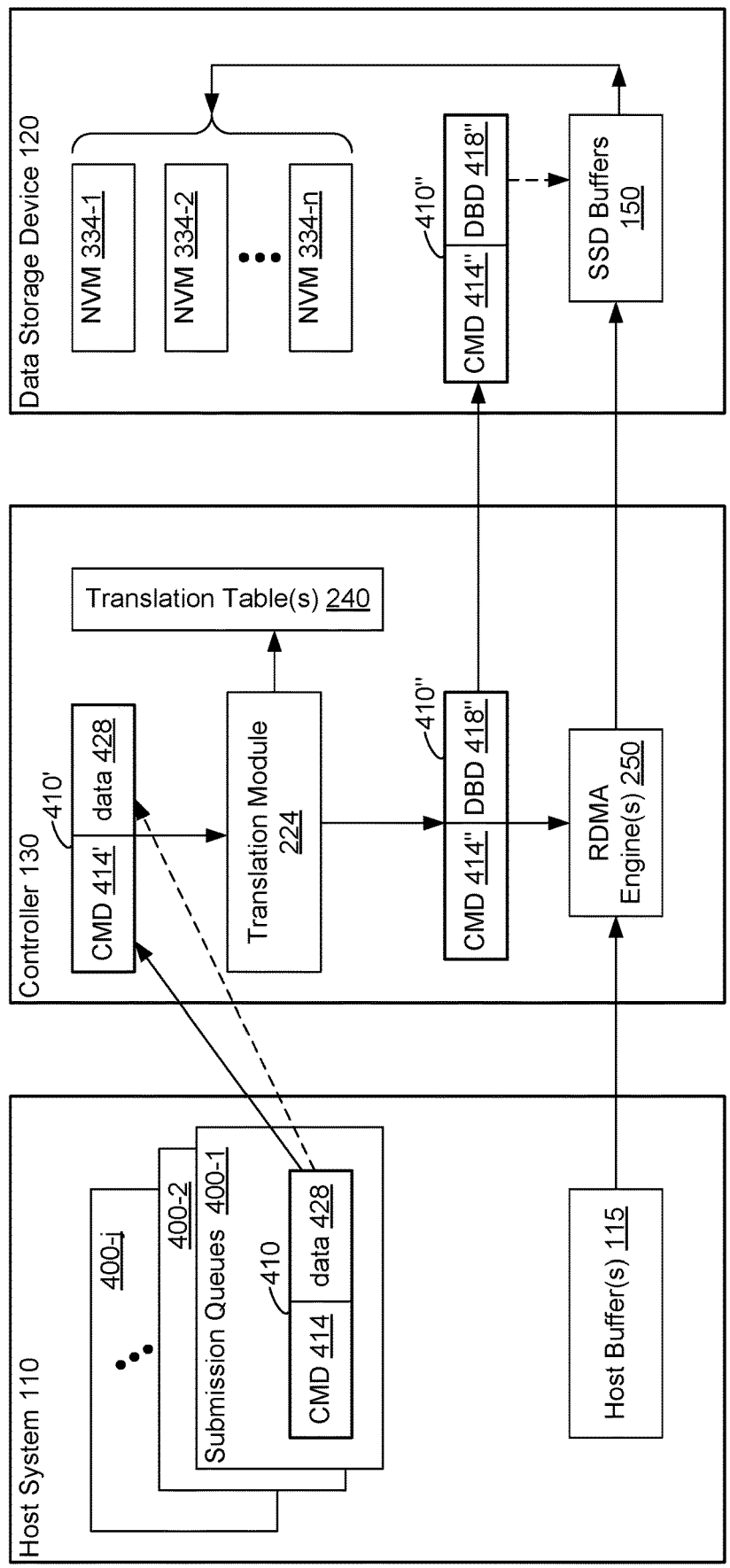
FIG. 4C is a diagram showing some elements of a host system, controller, and data storage device that participate in a remote direct memory access write immediate, in accordance with some embodiments.

FIG. 4B shows illustrative aspects of a read command issued by a host to a data storage device 120 through main controller 130. Similar to the earlier two figures, the read command 410 is sent to main controller 130. The addresses and pointers within the read command 410 may be translated to produce a modified command 410', with modifications related to storage virtualization actions, such as index traversing or TLB-based cashing to identify the target media 330 that will be read. This may be performed by main controller 130, including by the translation module or may be performed elsewhere in main controller 130 or on the host system 110. Translation module 224 also allocates a storage buffer 150 on one or more data storage devices 120 that are associated with the read command. Translation module 224 translates the command 410' into translated command 410," having a translated command 414" and a buffer descriptor 418". The host buffer descriptor 418 in the read command 410 is changed to a device buffer descriptor (DBD) 418" in the translated command 410".

During a read operation, translated command 410", which includes a pointer or other value indicating the allocated storage buffer 150, is provided to the data storage device. The allocated storage buffer 150, specified by the translated command, is the internal location within the data storage device 120 to which the read data is copied from the data storage device's storage medium. Accordingly, the data storage device 120 reads the data from storage locations specified by (if physical addresses are specified by the translated command) or corresponding to (if logical addresses are specified by the translated command) the translated command, within the data storage device's storage medium, to the specified storage buffer 150. When execution of the translated command 410" or relevant portion of the translated command 410" is completed, main controller 130 executes a remote DMA operation to transfer the read data directly from the allocated buffer 150 to the host buffer 115. This is possible because the allocated storage buffer 150 is directly accessible by the RDMA engine 250.

Additional details concerning the process of carrying out read and write commands are presented below with reference to FIGS. 5A-5D. FIGS. 5A-5D illustrate a flowchart representation of a method of translating commands to facilitate high speed reads and writes to data storage devices 120 from hosts 110 using a controller 130.

Figure 5A:
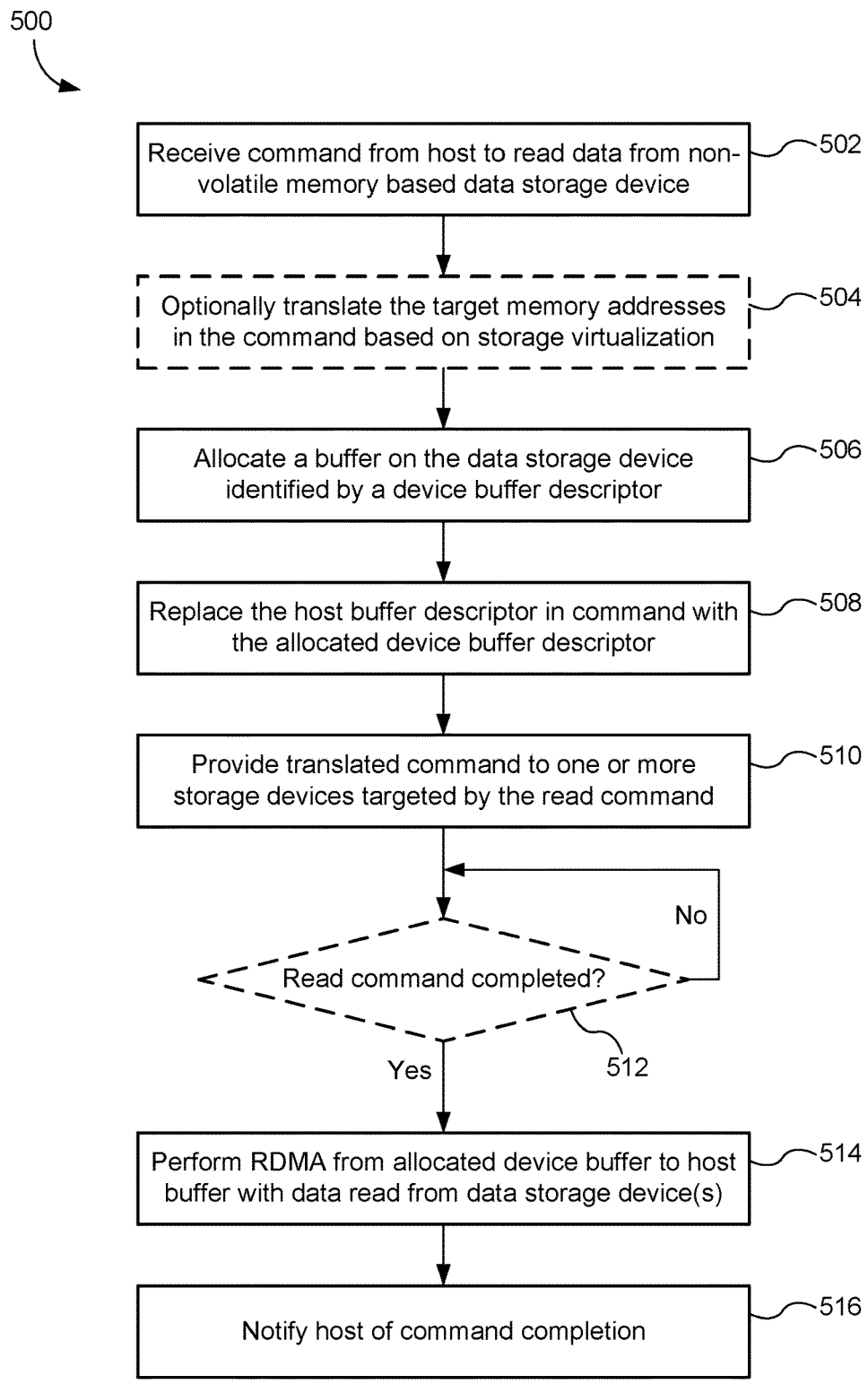
FIGS. 5A-5B illustrate a flowchart representation of a method of reading and writing, respectively, to a data storage device in accordance with some embodiments.
Figure 5B:
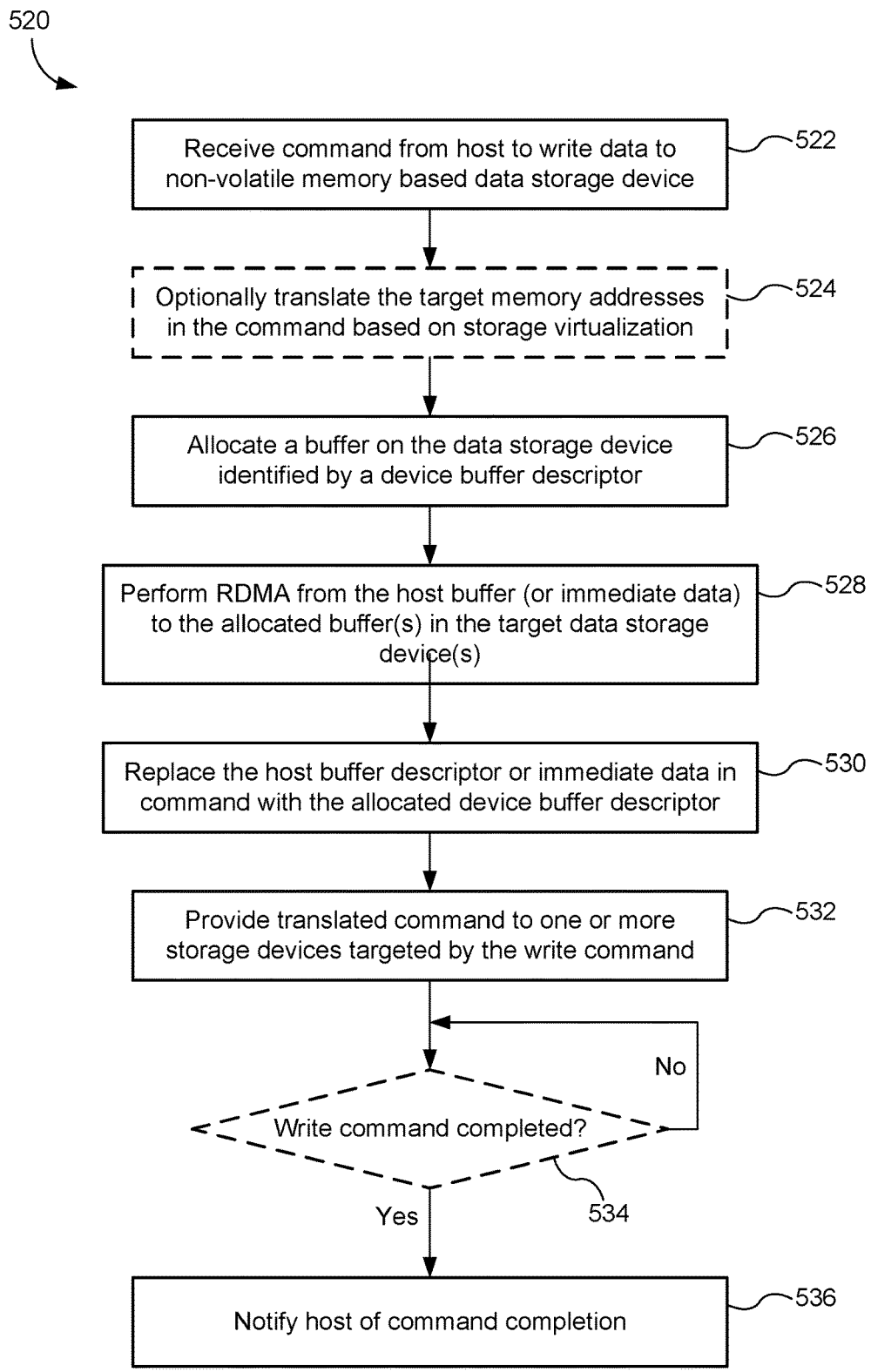

FIGS. 5A and 5B depict flow charts of methods of reading and writing from and to a non-volatile memory data storage device using a controller 130, such as an NVMe controller, a RAID controller or another controller type as described herein. Referring to FIG. 5A, method 500 may be implemented on a host 110, within a controller 130 or within a data storage device, or portions of the method may be implemented among these devices. For ease of explanation, but without loss of generality, method 500 is described as being performed by a controller 130 logically positioned between one or more host computer systems and a set of data storage devices, as shown in FIG. 1A. A read command is received (502) from a host computer system (e.g., a host 110, FIG. 1A), or a host command queue, to read data from a non-volatile memory-based data storage device 120. The read command specifies one or more memory addresses, corresponding to storage locations in the data storage device 120, from which data is to be read. The one or more memory addresses may include a name space indicator, and may include one or more logical block addresses in a logical address space of the host computer system. The one or more memory addresses are sometimes called target memory addresses. Optionally, the controller translates (504) the target memory addresses, according to storage virtualization or other translation protocols, to indicate or identify the target data storage device from which data is to be read. In some embodiments, the target memory addresses are translated in part by the controller and in part by the target data storage device. For example, in some embodiments the controller translates a namespace portion of the target memory addresses into a target data storage device indicator, while the target data storage device translates a logical block address portion of the target memory addresses into physical addresses in a physical address space of the target data storage device.

A buffer 150 on the target data storage device is allocated (506) and identified by a device buffer descriptor, which forms a portion of a translated read command generated from the received read command. In some embodiments, the allocation occurs after the read command is received, while in other embodiments the buffer is pre-allocated, prior to receipt of the read command. In some embodiments, the received read command is cloned and the host buffer descriptor in the command is replaced (508) with a device buffer descriptor corresponding to the allocated buffer within the target data storage device 120.

As described above, in some circumstances, a received host read command may specify target storage locations in multiple target data storage devices, and in such circumstances, buffers 150 are allocated in each of the target data storage devices. In some embodiments, in such circumstances the controller clones the received host read command so as to produce one cloned command per target data storage device 120, each with a device buffer descriptor specific to that data storage device 120.

The translated command is provided (510) to the one or more target data storage devices. This causes the data storage devices to read data from the non-volatile media associated with the read command addresses, and to write that data into the buffers allocated and specified by the device buffer descriptors (DBDs). When execution of the read command is completed (512) by the target data storage device(s), one or more RDMA data transfers are performed (514) between the buffer(s) in the target data storage device(s) and the host buffer identified by the host buffer descriptor. The RDMA data transfer is typically performed by or initiated by main controller 130, but in other embodiments could be initiated by the host computer system or the target data storage devices. The host is then notified of completion (516) of the read command.

Referring to FIG. 5B, method 520 may be implemented on a host 110, within a controller 130 or within a data storage device, or portions of the method may be implemented among these devices. For ease of explanation, but without loss of generality, method 520 is described as being performed by a controller 130 logically positioned between one or more host computer systems and a set of data storage devices, a shown in FIG. 1A. A write command (sometimes herein called a write request) is received (522) from a host computer system 110, or a host command queue, to write data to a data storage device 120. The write command specifies one or more memory addresses, corresponding to storage locations in the data storage device 120, to which data is to be written. The one or more memory addresses may include a name space indicator, and may include one or more logical block addresses in a logical address space of the host computer system. The one or more memory addresses are sometimes called target memory addresses. Optionally, the controller translates (524) the target memory addresses, according to storage virtualization or other translation protocols, to indicate which target data storage device to which data is to be written. In some embodiments, the target memory addresses are translated in part by the controller and in part by the target data storage device. For example, in some embodiments the controller translates a namespace portion of the target memory addresses into a target data storage device indicator, while the target data storage device translates a logical block address portion of the target memory addresses into physical addresses in a physical address space of the target data storage device.

A buffer 150 on the target data storage device is allocated (526) and identified by a device buffer descriptor. In some embodiments, the allocation occurs after the write command is received, while in other embodiments the buffer is pre-allocated, prior to receipt of the write command. As described above, in some circumstances, a received host write command may specify target storage locations in multiple target data storage devices, and in such circumstances, buffers 150 are allocated in each of the target data storage devices.

An RDMA data transfer is performed (528) between the host data buffer 115 and the allocated buffer(s) 150 in the target data storage device(s) involved in the write operation. The RDMA data transfer is typically performed by or initiated by main controller 130, but in other embodiments could be initiated by the host computer system or the target data storage devices. The result is that the data to be written is transferred to buffers 150 with the target data storage device(s) 120. When the command is a write immediate command, the data is transferred from memory storing the command directly to the targeted buffer(s) within the data storage device(s).

Optionally, for example in some circumstances, execution of the RDMA data transfer (528) performed for the received write command overlaps with execution of the RDMA data transfer (514) for the read command (see method 500, FIG. 5A).

The received write command is cloned and the host buffer descriptor (or immediate data in the case of a write immediate) in the command is replaced (530) with a device buffer descriptor corresponding to the allocated buffer 150 within the target data storage device 120. As described above, in some circumstances, a received host write command may specify target storage locations in multiple target data storage devices, and in such circumstances, the controller clones the write command so as to produce one cloned command per target data storage device 120, each with a device buffer descriptor specific to that data storage device 120.

The translated write command(s) 532 is(are) provided to the targeted data storage device(s) 120. Subsequently, each targeted data storage device executes the translated write command, which causes the targeted data storage device to the write the data in the allocated buffer to locations in the non-volatile media specified by or corresponding to the address information in the write command. When execution of the write command by the targeted data storage device is completed (534), a notification is sent (536) to the host.

In some embodiments, main controller 130 is configured to receive write and read requests at a much faster rate than those requests can be processed, and consequently main controller 130 temporarily stores received write requests and read requests in host command queue 230 (FIG. 2). In some embodiments, host command queue 230 is configured to store more than 100 pending write and read requests, and is typically configured to store several hundred (e.g., 300 or more) pending write and read requests. Main controller 130 processes requests from the host command queue 230, issues corresponding memory access commands to the data storage devices 120 and initiates corresponding RDMA data transfers. In some embodiments, non-volatile memory system 100 or 160 is configured to perform or execute 10 or more, or 50 or more, or 100 or more storage access commands, including the RDMA data transfers for those storage access commands, in parallel (e.g., concurrently, or during overlapping time periods).

For ease of reference, the host write command, sometimes called a write request, received by the main controller at 522 is a first write request, the host device from which the host write command is received is a first host device, the identified data storage device is a first identified data storage device, the RDMA data transfer is a first RDMA data transfer. In some embodiments, or in some circumstances, method 520 further comprises receiving, from either the first host device or a second host device external to the non-volatile memory system, a second write command (sometimes called a second write request) to write data. In response to receiving the second write command, the main controller performs a sequence of operations, including initiating execution of a second remote direct memory access (RDMA) data transfer from a memory location in the first or second host device (depending on the host device from which the second write command was received), specified by the second write command, to buffer space in a second identified data storage device, wherein execution of the second RDMA data transfer overlaps execution of the first RDMA data transfer. In some embodiments, the main controller is configured to concurrently execute multiple overlapping RDMA data transfers (e.g., 2 or more overlapping RDMA data transfers, or 4 or more overlapping RDMA data transfers, or 8 or more overlapping RDMA data transfers, or 50 or more overlapping RDMA data transfers, depending on the implementation), where each RDMA data transfer is an RDMA transfer of data between a respective host device and a respective data storage device of the plurality of data storage devices.

In some embodiments, operations 530 and 532 are aggregated for multiple host write commands, as explained in more detail next. More specifically, in some embodiments, operations 522 to 528 are performed for two or more host write commands, which results in write data being written to multiple buffers or multiple sets of buffers in the target data storage devices. When a predefined condition is reached, a single write command is sent by the main controller to the target data storage device so as to write the data in the multiple buffers to non-volatile storage. In some embodiments, the predefined condition is: the amount of write data in the buffers of a target data storage device meeting a predefined threshold, the amount of available buffer space in the target data storage device falling to predefined level, the passage of a predefined amount of time since write data was written to a buffer in the target data storage device without being written or flushed to non-volatile storage, or the occurrence or detection of a power fail or shutdown event.

As noted above, in some embodiments, memory 206 of main controller 130 also includes one or more RDMA buffers 282, for temporarily storing data or information being transferred between a host and data storage device (e.g., SSD), as discussed below. In particular, in some circumstances or in some embodiments, the above described method 500 or method 520, optionally includes transferring data to one or more RDMA buffers 282 (FIG. 2) in main controller 130 as a waypoint while transferring data between a host system and data storage device. For example, in method 500, for processing a read command from a host system, RDMA operation 514 may include both an RDMA transfer of data from a buffer of the target data storage device to an RDMA buffer 282, and a subsequent RDMA transfer of data (e.g., the same data, or a portion of the same data) from the RDMA buffer 282 to the host buffer identified by the host buffer descriptor of the read command. Similarly, in method 520, for processing a write command from a host system, RDMA operation 514 may include both an RDMA transfer of data from a host buffer 115 of the requesting host to an RDMA buffer 282, and a subsequent RDMA transfer of data (e.g., the same data, or a portion of the same data) from the RDMA buffer 282 to a buffer of the target data storage device.

Figure 5C:
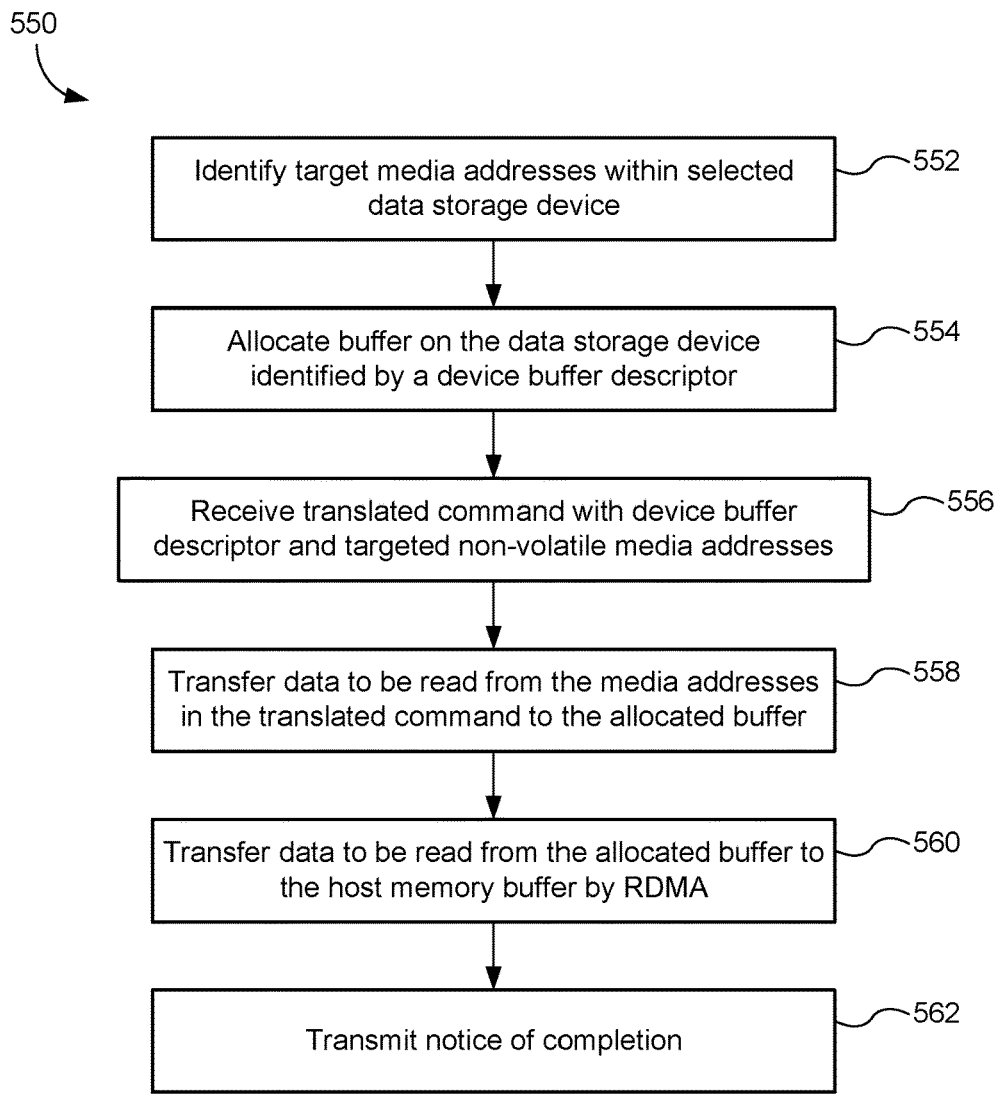
FIGS. 5C and 5D illustrate a flowchart representation of a method performed on a data storage device of reading from and writing to, respectively, the data storage device in accordance with some embodiments.

FIG. 5C illustrates a flowchart of a method 550 of processing a read command (e.g., a read command sent by a host 110, see FIG. 1A) that may be implemented on a data storage device 120 working with a separate main controller 130 (e.g., see FIG. 1A). In method 550, the data storage device receives (552) address information associated with a read command and identifies that it is a target for the read command. The targeted data storage device(s) thereafter allocates (554) a buffer to receive data to be read out of the non-volatile media associated with the targeted addresses of the read command. Alternatively, the buffer may be pre-allocated, prior to receipt of the read command. The data storage device receives (556) a cloned read command specifying the memory addresses in the non-volatile media and the buffer identified by the device buffer descriptor. Thereafter the data is transferred (558) from the non-volatile media to the allocated buffer within the data storage device. Subsequently, the data is further transferred (560), using an RDMA process, directly from the device buffer to the host buffer identified by the host buffer descriptor in the original read command issued by a host computer system 110 and received by the main controller 130. In some embodiments, after data is transferred from the non-volatile media to the allocated buffer within the data storage device and interrupt or other signal is transmitted from the targeted data storage device(s) to the main controller 130 to signal that the read data is ready for transfer. However, in some embodiments, the fact that the read data is ready for transfer from the data storage device's allocated buffer is determined by the main controller 130 polling the targeted data storage device(s) to determine the completion status of the cloned read command. Finally, notice of completion of the read command is transmitted (562) when the data has been transferred from the data storage device's buffer to the host buffer.

Figure 5D:
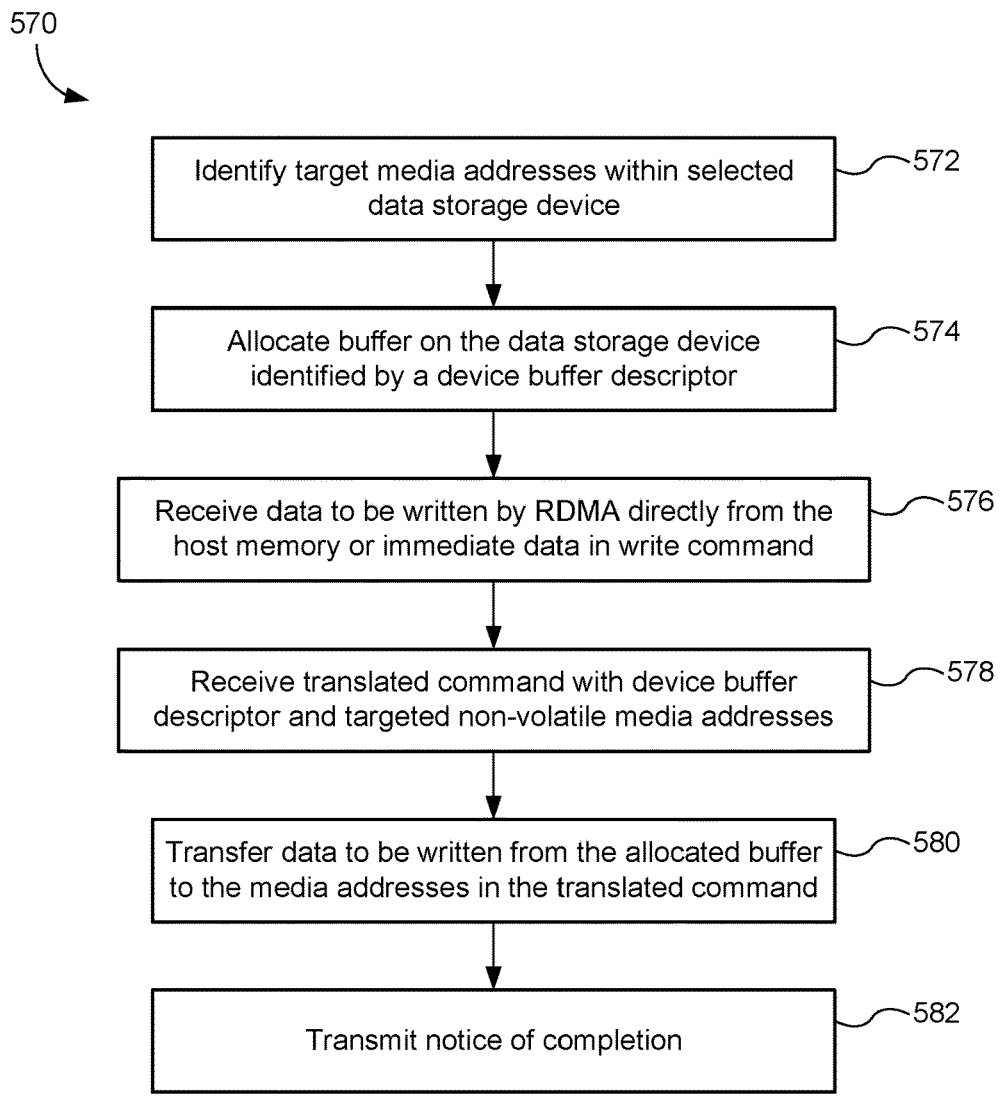

FIG. 5D depicts a method 570 of processing a write command (e.g., a write command sent by a host 110, see FIG. 1A) that may be implemented on a data storage device 120 working with a separate main controller 130 (e.g., see FIG. 1A). In method 570, the data storage device receives (572) address information associated with a write command and identifies that it is a target for the write command. The targeted data storage device thereafter allocates (574) a buffer to receive data to be written to locations in the target data storage device's non-volatile media specified by, or corresponding to, address information in the write command. Alternatively, the buffer may be pre-allocated prior to receipt of the write command. The data to be written is then received (576) directly from the host buffer (or from the immediate data in the case of a write immediate command) through a RDMA process, which is typically initiated by main controller 130. The data storage device receives (578) a cloned write command specifying the memory addresses in the non-volatile media and the buffer identified by the device buffer descriptor. The device buffer descriptor replaces the host buffer descriptor or the immediate data of the write command. Thereafter the data is transferred (580) from the allocated buffer to the non-volatile media specified by the memory addresses in the cloned command. In some embodiments, notice of completion is transmitted (582) when the data has been transferred from the data storage device's buffer.

In some embodiments, the allocated buffer is battery backed or otherwise non-volatile, and the targeted data storage device includes power fail mechanisms to ensure that any data stored in its buffers is not lost in the event of a power failure. In some such embodiments, once the data is successfully copied or transferred from the host buffer to the allocated buffer, the write command is assumed to have been successfully completed. As a result, a notice of completion is not transmitted (582) when the data has been transferred from the data storage device's buffer; however, in some such embodiments, a notice of completion is transmitted by main controller 130 to the host device which send the write command when the RDMA transfer of data from the host buffer to the allocated buffer is completed.

Figure 6:
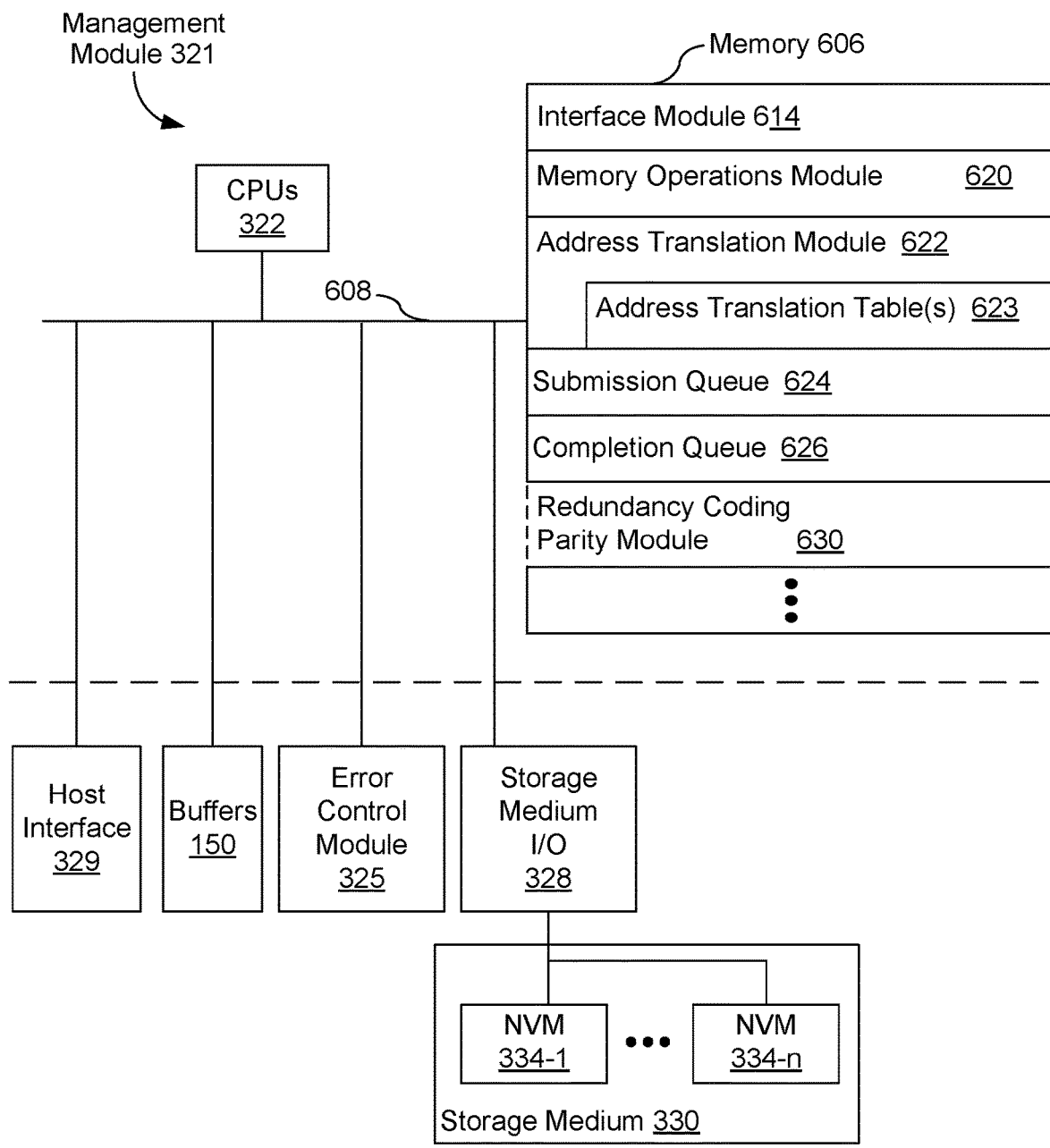
FIG. 6 depicts a block diagram of a memory management unit of a data storage device that is part of a non-volatile memory system, in accordance with some embodiments.
Figure 7A:
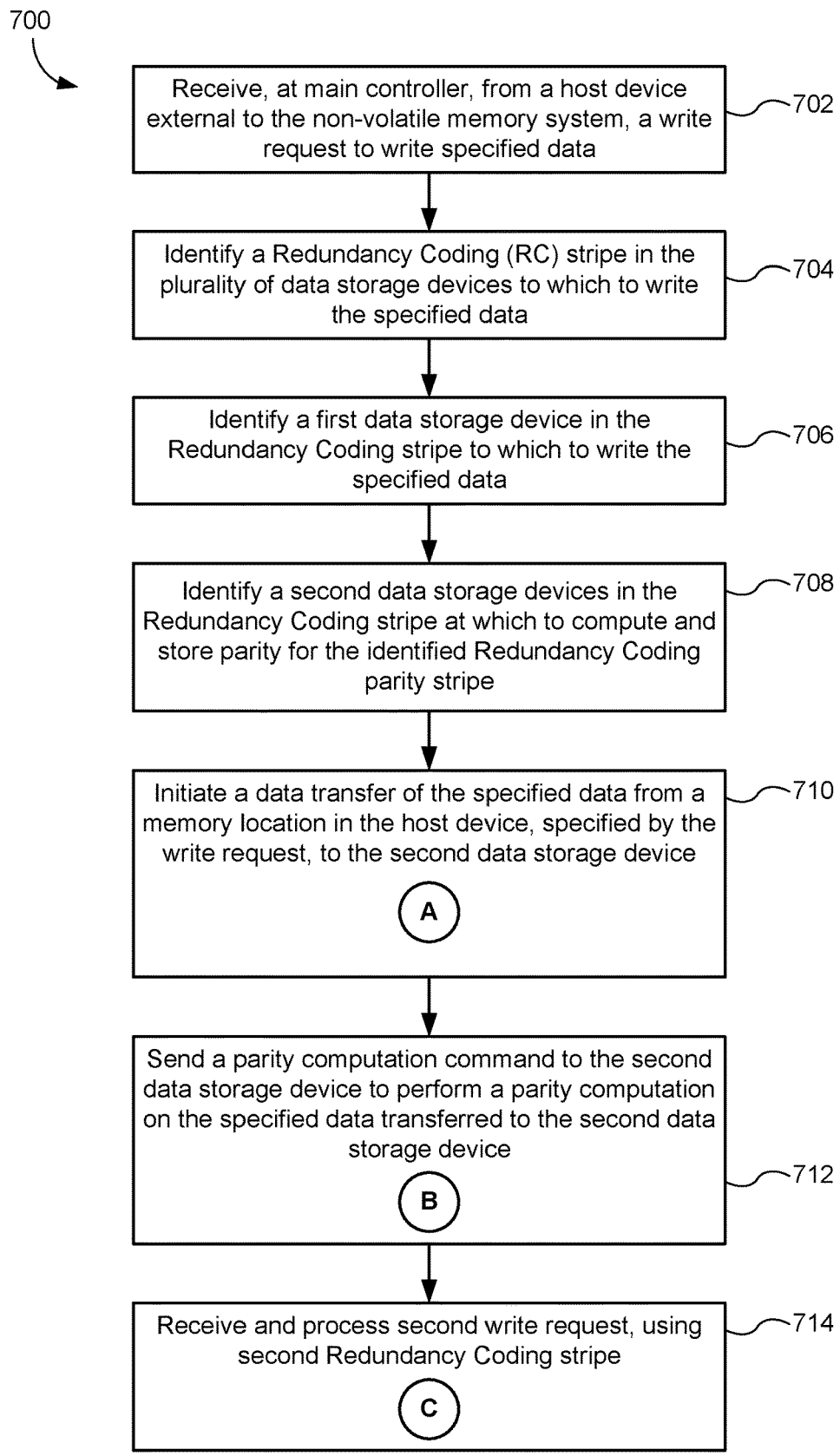
FIGS. 7A-7D illustrate a flowchart representation of a methods of writing data to data storage devices and offloading parity generation to at least one of the data storage devices.
Figure 7B:
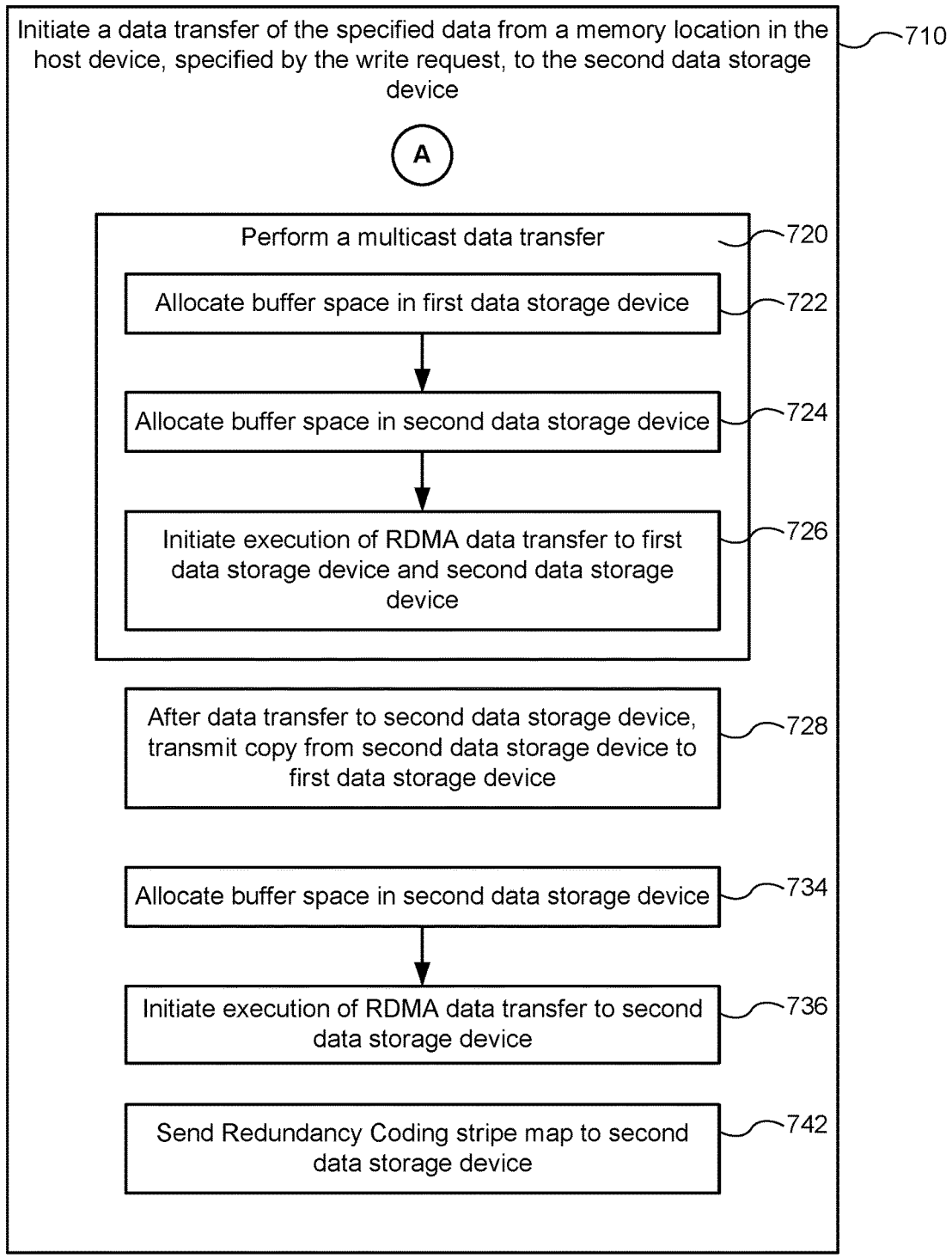
Figure 7C:
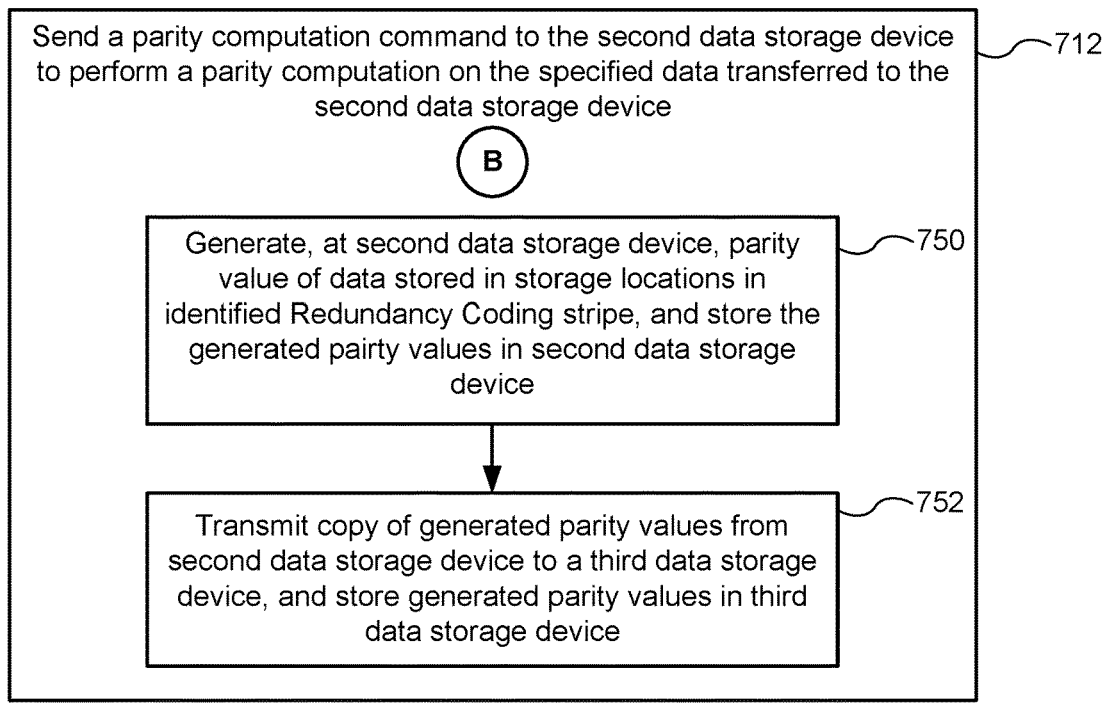
Figure 7D:
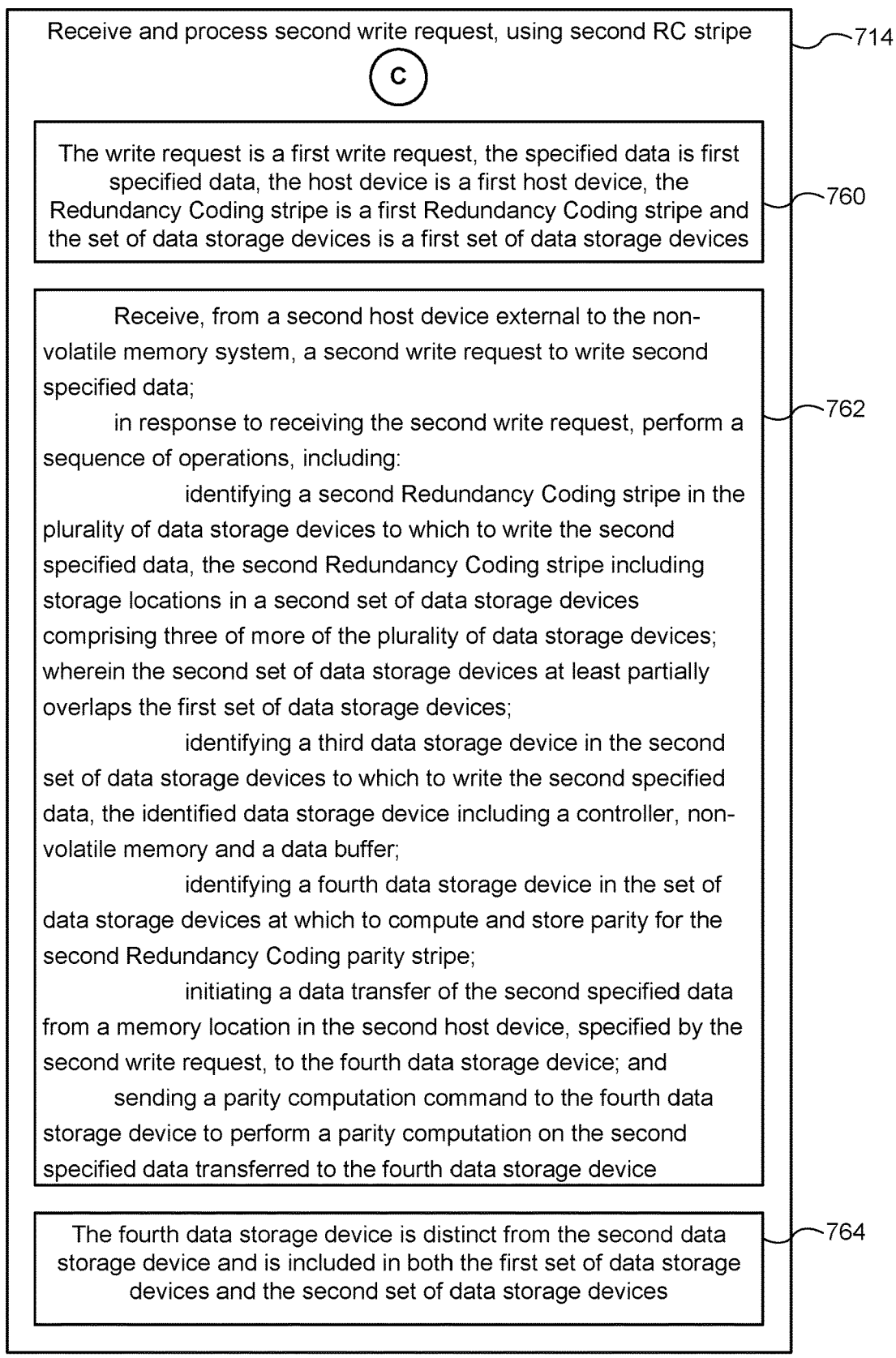

FIG. 6 depicts a block diagram of a management module 321, within a storage controller 324 of a data storage device 120 (e.g., a solid state drive) that is part of a non-volatile memory system 100 (FIG. 1A), in accordance with some embodiments. Thus, in some embodiments, each data storage device 120 of a non-volatile memory system 100 includes an instance of management module 321, which in some other embodiments, only some (e.g., one or more, or two or more) of the data storage device 120 of non-volatile memory system 100 include an instance of management module 321.

Referring to FIG. 6, management module 321 includes one or more processing units 322 (further described above with reference to FIG. 3), coupled to memory 606, a host interface 329, buffers 150, error control module 325 and storage medium interface 328 over data connections 608. Additional elements may be included in the storage controller but are not shown here for brevity. Management module 321 controls access to the non-volatile media on its associated sold state drive.

Memory 606, sometimes called controller memory, includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 606 optionally includes one or more storage devices remotely located from processor(s) 322. Memory 606, or alternately the non-volatile memory device(s) within memory 606, comprises a non-transitory computer readable storage medium. In some embodiments, memory 606, or the computer readable storage medium of memory 606 stores the following programs, modules, and data structures, or a subset or superset thereof:

Interface module 614 used for communicating with main controller 130 via host interface 329, and optionally other components such as non-volatile memory devices 334 via storage medium interface 328 and error control module 325.

A memory operations module 620 that executes read and write commands (sometimes herein called translated commands) received from main controller 130, and optionally allocates buffers 150 for receiving data to be stored in the data storage device and for receiving data read from the data storage device. In some other embodiments, main controller 130 allocates buffers 150. Execution of a respective write command includes writing data in one or more buffers 150 (allocated for storing the write data) into non-volatile storage medium 330. Execution of a respective read command includes reading data from non-volatile storage medium 330 to one or more buffers 150 allocated for execution of the read command. In some embodiments, each received read and write command is stored in a submission queue 624 until execution of the command by the data storage device is completed, after which it is moved to a completion queue 626. In some embodiments, after transfer of read data from buffers 150 to the requesting host system using RDMA, in the case of read commands, and after notification of execution completion in the case of write commands, the completed command is removed from completion queue.

In some embodiments, an Address Translation module 622 translates logical addresses in received (translated) commands into physical addresses in the physical address space of the data storage device, and updates one or more address translation tables 623 to keep track of the correspondence between logical and physical addresses. In some embodiments, address translation is performed by main controller 130 instead of the individual storage devices.

One or more submission queues 624 may be used to store status information regarding translated read and write commands received from hosts 110, the execution of which has not yet been completed; and One or more completion queues 626 may be used to store completion information regarding translated read and write commands received from hosts 110, the execution of which has been completed, which completion information may be propagated back to the hosts that sent the original commands.

Optionally, in some embodiments, memory 606, or the computer readable storage medium of memory 606 also stores a Redundancy Coding parity module 630, for computing and storing parity information in storage medium 330 of the data storage device 120 in which management module 321 resides.

Parity Offload

In some embodiments, to facilitate parity generation and increase the rate of storage to a storage system incorporating data storage devices (e.g., storage system 100, FIG. 1A), main controller 130 (e.g., See FIG. 1A or 1B), while processing a write command received from a host computer 110, offloads parity generation for the write data to one or more of the data storage devices 120 of the storage system 102 or 162, as described in more detail below. This is in contrast to systems in which parity is computed by the main controller 130 of the storage system 100 or 160, or by a host system 110.

Referring back to FIG. 2, the non-volatile storage devices 120-1 to 120-$m$ in a non-volatile storage system 100 (FIG. 1A) or 160 (FIG. 1B) can be used to store data using redundant data-based protection schemes, sometimes called Redundancy Coding, one example of which is RAID (redundant array of independent disks). Numerous types or levels of Redundancy Coding and RAID are well known, and the present document does not presume to fully describe all types or levels of Redundancy Coding and RAID, nor to describe new levels or types of Redundancy Coding. Rather, this document presents new systems and methods for computing parity information for any such Redundancy Coding system, so as to improve system efficiency and scalability. In some embodiments, for a given Redundancy Coding or RAID system, storage locations in storage devices 120-1 to 120-M are divided into Redundancy Coding stripes, each having storage locations in a predefined number, D, of data storage devices, such as 6 or 8 or 10 or other number. D is generally an integer equal to 2 or more, and is typically 4 or more, and more typically is equal to 6 or more or 8 or more.

In some embodiments, the sets of data storage devices in which the storage locations are located for various Redundancy Coding stripes (within a single storage system 100 or 160) are overlapping. Stated another way, in many systems, the sets of data storage devices used to store Redundancy Coding stripes A and B, or Redundancy Coding Stripes A1 to An, where n is an integer greater than 2, are overlapping. For example, a first Redundancy Coding stripe includes storage locations in data storage devices 120-1 to 120-$s$, a second Redundancy Coding stripe includes storage locations in data storage devices 120-2 to 120-$s$+1, a third Redundancy Coding stripe includes storage locations in data storage devices 120-3 to 120-$s$+2, and so on, where s is the number of data storage devices in each Redundancy Coding stripe.

In some Redundancy Coding levels or types, parity information is stored in just one data storage device for each Redundancy Coding stripe, whereas in some other Redundancy Coding levels or types, parity information is stored in two or more data storage devices for each Redundancy Coding stripe. For example, in FIG. 2A, each data storage device in which data is stored for a particular Redundancy Coding stripe is labelled "D", while each data storage device in which parity is stored is labelled "P". FIG. 2B schematically represents a storage system using a Redundancy Coding parity storage pattern of interest that includes both "local" and "global" parity values. In FIG. 2B, each data storage device in which data is stored for a particular Redundancy Coding stripe is labelled "D", each data storage device in which local parity is stored is labelled "LP", and the data storage device in which global parity is stored is labelled "GP". In systems of this latter type, herein called local/global Redundancy Coding systems, multiple Redundancy Coding sub-stripes 290 (e.g., sub-stripes 290-1 to 290-$m$) each have a local parity data storage device, labelled LP in FIG. 2B, (or, alternatively, two or more local parity data storage devices), and the set of multiple Redundancy Coding stripes also includes a global parity data storage device, labelled "GP" in FIG. 2B. The multiple Redundancy Coding sub-stripes 290 and the global parity data storage device together comprise a single Redundancy Coding stripe 292. When data is written to the Redundancy Coding stripe, both local parity and global values are generated. Parity generation and data recovery in local/global Redundancy Coding systems is discussed below. Since there are many Redundancy Coding levels or types and numerous variations in how those Redundancy Coding levels or types are implemented, further description of such Redundancy Coding levels and types is not provided herein, except as it may be relevant to the various embodiments of systems and methods for generating the parity information and storing data in systems that implement such Redundancy Coding levels or types.

As briefly described above with reference to FIG. 2, the main controller 130 of a storage system 100 or 160 may include a stripe map engine 650, which optionally includes or uses a stripe map 652, and more generally maps write data for any given write request to a Redundancy Coding stripe, which can be called the identified Redundancy Coding stripe. In some embodiments, stripe map engine 650 determines both a first data storage device within the identified Redundancy Coding stripe to which to write the data and a second data storage device within the identified Redundancy Coding stripe at which to compute parity data for data that includes the specified data to be written to the first data storage device.

The pattern or mapping method used to assign selected drives for parity generation may static or dynamic. In some embodiments, the selected drive is randomly selected from among the available drives. In some embodiments, the selected drive is changed on a rotating basis with each successive write or at regular or irregular intervals. Thus, in some embodiments, multiple selected drives operate in parallel to generate parity in accordance with a parity offload arrangement. Multiple selected drives operate in parallel to generate parity and propagate parity and/or data to other drives based on the stripe map in some embodiments.

In some embodiments, the stripe map for each stripe includes location information for all "chunks" in the stripe, including data chunks and one or more parity chunks. Each chunk corresponds to the physical space used to store data or parity in a single data storage device in the stripe. A chunk is typically a set of one or more blocks located on a single drive. In some embodiments, the location information for each chunk can be of the form (SSD, LBA) for each chunk, where SSD identifies the data storage device in which the chunk is stored, and LBA is (or identifies) the logical block address mapped to the location at the beginning of the chunk. Thus, in such embodiments, the stripe map for each stripe is of the form (SSD1, LBA1), (SSD2, LBA2), . . . (SSDc, LBAc), where c is the number of chunks in the stripe. The stripe map optionally includes a stripe identifier, but in some embodiments the stripe identifier is inferred from the location (e.g., the entry number) of the stripe map in a table of stripe maps. Other forms of stripe maps may be used. Typically, the stripe map for each stripe contains the information needed to locate all data and parity in the stripe. In some embodiments, each stripe map is dynamically generated when space for the stripe is allocated in the non-volatile memory system 100 (FIG. 1A).

As briefly described above with reference to FIG. 6, in some embodiments, each data storage device that participates in using Redundancy Coding storage for data protection includes a Redundancy Coding parity module 630 for generating and storing parity value. While in some embodiments only a subset of the data storage devices in the storage system (e.g., storage system 100 or 160) have such a module, because only a subset of the data storage devices are used to compute and store parity, more typically parity computation and storage is spread across all the data storage devices in the system that participate in Redundancy Coding storage for data protection, so as to spread the parity computation load as evenly as possibly across all data storage devices in the storage system.

In some embodiments, to facilitate parity generation and increase the rate of storage to a storage system incorporating data storage devices (e.g., storage system 100, FIG. 1A), main controller 130 (e.g., See FIG. 1A or 1B), while processing a write command received from a host computer 110, offloads parity generation for the write data to one or more of the data storage devices 120 of the storage system 102 or 162, as described in more detail below. This is in contrast to systems in which parity is computed by the main controller 130 of the storage system 100 or 160, or by a host system 110.

FIGS. 7A-7D illustrate a flowchart representation of a method 700 of writing data to data storage devices and offloading parity generation to at least one of the data storage devices. As noted above, In some embodiments, to facilitate parity generation and increase the rate of storage to a storage system incorporating data storage devices (e.g., storage system 100, FIG. 1A), main controller 130 (e.g., See FIG. 1A or 1B), while processing a write command received from a host computer 110, offloads parity generation for the write data to one or more of the data storage devices 120 of the storage system 102 or 162. This will now be described in more detail.

Method 700 is performed in a non-volatile memory system (e.g., NVM system 100, FIG. 1A) having a main controller (e.g., main controller 130) and a plurality of data storage devices (e.g., data storage devices 120-1 to 120-m, where m is an integer greater than 2, is typically an integer equal to 4 or more, and more typically is an integer equal to 6 or more or 8 or more), such as those shown in FIG. 1A. In some embodiments, the main controller is a non-volatile memory express (NVMe) controller.

The method includes, at the main controller, receiving (702) from a host device external to the non-volatile memory system, a write request to write specified data. For instance, the specified data may be a predefined unit of data, such as a page (e.g., 4K bytes) or an integer multiple of a predefined unit of data, or a fractional unit of data that has been padded, or is to be padded when stored, with predefined data or other filler data, so as to have a size equal to the predefined unit of data or an integer multiple of the predefined unit of data. For ease of explanation, it will be assumed that the specified data is a single predefined unit of data.

In response to receiving the write request, the main controller performs a sequence of operations, including: identifying (704) a Redundancy Coding stripe (sometimes abbreviated as "RC stripe") in the plurality of data storage devices to which to write the specified data, the Redundancy Coding stripe including storage locations in a set of data storage devices comprising three of more of the plurality of data storage devices; identifying (706) a first data storage device in the set of data storage devices to which to write the specified data, the identified data storage device including a controller, non-volatile memory and a data buffer (e.g., see storage device 120 in FIG. 3); identifying (708) a second data storage device in the set of data storage devices at which to compute and store parity for the identified Redundancy Coding parity stripe; initiating (710) a data transfer of the specified data from a memory location in the host device, specified by the write request, to the second data storage device; and sending (712) a parity computation command to the second data storage device to perform a parity computation on the specified data transferred to the second data storage device.

It is noted that method 700, and operation 710 in particular, calls for "initiating" a data transfer. This is because, in some embodiments, data is transferred to any data storage device in the NVM system using remote DMA (RMDA) data transfers, for example using any of the methodologies described above with reference to FIGS. 4A-4C and 5A-5D. In such embodiments, initiating the data transfer 710 includes allocating (734) buffer space in the second data storage device to receive the specified data; and initiating (736) execution of a remote direct memory access (RDMA) data transfer of the specified data from a memory location in the host device to the allocated buffer space in the second data storage device.

It should be noted here that the above sequence of operations includes transferring the specified data to the second data storage device, at which parity is to be computed, but does not necessarily include transferring the specified data to the first data storage device, at which the specified data is to be stored. This is because, in some embodiments, after completion of the data transfer of the specified data from the host device to the second data storage device, a copy of the specified data is transmitted (728) from the second data storage device to the first data storage device, and the specified data is stored in storage locations of the first data storage device in the identified Redundancy Coding stripe. In some embodiments, the data transfer from the second data storage device to the first data storage device is initiated by the second data storage device. In some embodiments, the second data storage device uses information provided to it by the main controller to determine which data storage device is the first data storage device to which a copy of the specified data is to be transmitted. For example, in some embodiments, the parity computation command, or a separate command, sent by the main controller to the second data storage device, includes: an identifier of the first data storage device, or physical address in the data storage device at which the specified data is to be stored, or a stripe map or strip map information, from which the identity of the first data storage device is determined by the second data storage device. In some such embodiments, the sequence of operations (710) performed to initiate a data transfer includes sending (742) a Redundancy Coding stripe map to the second data storage device, the Redundancy Coding stripe map indicating which data storage devices of the plurality of data storage devices are included in the set of data storage devices.

In some embodiments, the sequence of operations performed as part of operation 710 includes performing (720) a multicast data transfer (e.g., using RDMA) to concurrently transfer the specified data to both the first data storage device and the second data storage device. More specifically, in some embodiments, the multicast data transfer is accomplished by: allocating (722) buffer space in the first data storage device to receive the specified data; allocating (724) buffer space in the second data storage device to receive the specified data; and initiating (726) execution of a remote direct memory access (RDMA) data transfer of the specified data from a memory location in the host device to the allocated buffer space in the first data storage device and to the allocated buffer space in the second data storage device. In embodiments using such multicast data transfers, operation 728 (for transmitting a copy of the specified data from the second data storage device to the first data storage device) is not performed, as there is no need to transmit a copy of the data from the second data storage device to the first data storage device.

In some embodiments, method 700 includes the second data storage device generating (750) parity values for data stored in storage locations in the identified Redundancy Coding stripe that are located in a plurality of data storage devices of the set of data storage devices, and storing the generated parity values in storage locations in the identified Redundancy Coding stripe that are located in the second data storage device. In some embodiments, the generated parity values are initially stored in volatile memory (e.g., DRAM) in the second data storage device's controller, and are written to non-volatile memory in the identified Redundancy Coding stripe, in the second data storage device, only when all data to be written the identified Redundancy Coding stripe has been received and included in the generated parity values (or alternatively stated, only after all data to be stored in the identified Redundancy Coding stripe has been included in the parity computation).

Thus, parity generation is offloaded from the main controller to a data storage device. As shown in FIGS. 3 and 6, in some embodiments, the data storage device, labelled "storage device 120" in FIG. 3, includes a management module 321 having one or more hardware processing units (CPUs 322) and a Redundancy Coding parity module 630 for generating parity values, and for storing those parity values in the data storage device.

Furthermore, in systems using Redundancy Coding parity schemes that include storing the parity values for a Redundancy Coding stripe in more than one storage device, Redundancy Coding parity module 630 optionally generates all the parity values to be stored, within the Redundancy Coding stripe, in two or more storage devices 120. Optionally, in some embodiments, the same parity values are stored, within the Redundancy Coding stripe, in two or more storage devices. In some such embodiments, a copy of the generated parity values is transmitted (752) from the second data storage device to a third data storage device in the set of data storage devices, and the generated parity values are stored in storage locations in the identified Redundancy Coding stripe that are located in the third data storage device.

In some embodiments, the aforementioned write request is a first write request (760), the specified data is first specified data, the host device is a first host device, the Redundancy Coding stripe is a first Redundancy Coding stripe and the set of data storage devices is a first set of data storage devices, and method 700 further includes: receiving (714), from a second host device external to the non-volatile memory system, a second write request to write second specified data; and in response to receiving the second write request, performing (762) a sequence of operations, including: identifying a second Redundancy Coding stripe in the plurality of data storage devices to which to write the second specified data, the second Redundancy Coding stripe including storage locations in a second set of data storage devices comprising three of more of the plurality of data storage devices; wherein the second set of data storage devices at least partially overlaps the first set of data storage devices; identifying a third data storage device in the second set of data storage devices to which to write the second specified data, the identified data storage device including a controller, non-volatile memory and a data buffer; identifying a fourth data storage device in the set of data storage devices at which to compute and store parity for the second Redundancy Coding parity stripe; initiating a data transfer of the second specified data from a memory location in the second host device, specified by the second write request, to the fourth data storage device; and sending a parity computation command to the fourth data storage device to perform a parity computation on the second specified data transferred to the fourth data storage device. In some embodiments, the second host device is a different host device than the first host device. In some other embodiments, the second host device and the first host device are the same host device.

In some embodiments of method 700 that include receiving and processing a second write request (714, 762), the aforementioned fourth data storage device is distinct (764) from the second data storage device and is included in both the first set of data storage devices and the second set of data storage devices. In some embodiments, the second data storage device is identified in accordance with the application of a mapping function to a logical address specified by the first write request, and the fourth data storage device is identifying in accordance with the application of the mapping function to a logical address specified by the second write request. Furthermore, in some embodiments, the first set of data storage devices is identified in accordance with the application of a mapping function to a logical address specified by the first write request, and the second set of data storage devices is identified in accordance with the application of the mapping function to a logical address specified by the second write request.

In some embodiments, such as embodiments (e.g., schematically shown in FIG. 2B) that store both local and global parity information in order to provide an additional level of data protection, a multicast data transfer is used to transfer the specified data to two data storage devices, one for generating and storing local parity values for the specified data and another for generating and storing global parity values for the specified data. Those two data storage devices, herein called the local parity data storage device and the global parity data storage device, are identified in a variation of operation 708, described above, in accordance with the identified Redundancy Coding stripe to which the specified data is to be written. The global parity data storage device, which is to generate and store global parity values, receives all data to be written to the entire stripe, including data to be written to all mini-stripes in the stripe. As data is received, global parity values are generated or updated (e.g., by XORing the data stored in different portions, sometimes called chunks, of the stripe), and are typically stored in volatile memory, or NVRAM (e.g., battery backed DRAM), until global parity values have been generated for all data to be written in the entire stripe, and then the global parity values are stored to non-volatile memory in the global parity data storage device. In some embodiments, the local parity data storage device performs the operations described herein as being performed by the second data storage device. However, in some other embodiments, the global parity data storage device generates both global and local parity values associated with the specified data, including the local parity values for the specified data, and sends the local parity values to the second data storage device for storage (or alternatively, sends the local parity values to the second data storage device for storage when all data to be written the corresponding mini-stripe (290, FIG. 2B) has been received and included in the generated local parity values).

In some embodiments, a variation of method 700 is performed in non-volatile memory systems that use direct attached storage, in which case there is no main controller in the non-volatile memory system. In such embodiments, one or more host systems 110 are configured to perform all the tasks described herein, with respect to method 700, as being performed by the main controller 130 of a non-volatile memory system 100 or 160.

In some embodiments method 700 is, at least in part, performed by or implemented by a memory controller 130 (e.g., main controller 130) of a non-volatile memory system (e.g., non-volatile memory system 100 or 160) that includes a storage interface for coupling the memory controller to a plurality of data storage devices (e.g., solid state drives (SSDs) 120), a host interface (e.g., host interface 202, FIG. 2), and a write request processing module (e.g., host command processing module 220, FIG. 2). The host interface receives, from one or more host devices (e.g., host systems 110, FIG. 1A) external to the memory controller, write requests and read requests, each write request comprising a request to write specified data from a respective host device to a respective data storage device, and each read request comprising a request to read requested data from a respective data storage device and convey the read data to a respective host device. The write command processing module processes a respective write request from a respective host device by performing a sequence of operations, including: identifying a Redundancy Coding stripe in the plurality of data storage devices to which to write the specified data, the Redundancy Coding stripe including storage locations in a set of data storage devices comprising three of more of the plurality of data storage devices; identifying a first data storage device in the set of data storage devices to which to write the specified data, the identified data storage device including a controller, non-volatile memory and a data buffer; identifying a second data storage device in the set of data storage devices at which to compute and store parity for the identified Redundancy Coding parity stripe; initiating a data transfer of the specified data from a memory location in the host device, specified by the write request, to the second data storage device; and sending a parity computation command to the second data storage device to perform a parity computation on the specified data transferred to the second data storage device.

In some embodiments of the aforementioned memory controller, each data storage device of the plurality of data storage devices in the non-volatile memory system includes non-volatile memory for durably storing information, one or more data buffers for temporarily storing information being written to or read from the non-volatile memory of the data storage device, and a storage controller (e.g., an SSD controller) for controlling operation of the data storage device, including execution of read and write commands. In some embodiments, the non-volatile memory of each data storage device of the plurality of data storage devices is or includes flash memory, and the one or more data buffers of each data storage device of the plurality of data storage devices includes non-volatile RAM, such as battery-backed DRAM.

In some embodiments of the aforementioned memory controller, the memory controller is configured to perform and/or initiate the performance of the method of any of the embodiments of method 700 described above.

In some embodiments, a non-transitory computer readable storage medium stores one or more programs configured for execution by a memory controller (e.g., storage controller 324, FIG. 3) configured to be coupled to one or more host devices and a plurality of data storage devices. The one or more programs include instructions that when executed by one or more processors of the memory controller, cause the memory controller to perform and/or initiate the performance of any of the embodiments of method 700 described above.

Embodiments Using Data "Pull" by Parity Computation SSD

In the embodiments of method 700 described above, data is "pushed" to the SSD at which parity is to be computed (sometimes called the parity computation SSD), where "pushed" means that the main controller initiates a data transfer, using DMA or RDMA, of the data to that SSD. However, in some other embodiments, the SSD at which parity is to be computed "pulls" the specified data from a buffer in the SSD at which the data is to be stored (sometimes herein called the first data storage device of the data SSD), a buffer in the main controller, or an intermediate buffer (e.g., an intermediate buffer located at or in bus interface 204, FIG. 2).

For example, in some embodiments, the main controller transfers data into a local buffer of the main controller, and either transfers that same data to a buffer in the data SSD, at which the data is to be stored, or tells the data SSD to pull the data from the buffer in the main controller. The main controller sends an command or instruction to the parity computation SSD, which causes the parity computation SSD to pull the data from the buffer in the main controller, for example using a DMA operation, and then update locally stored parity information using the received data. When writing data to the corresponding Redundancy Coding stripe is completed, the parity computed by the parity computation SSD is stored in the parity computation SSD. For implementations in which parity is stored in more than one parity computation SSD for each Redundancy Coding stripe, the parity computation SSD either pushes parity information to the other parity SSD(s), or sends the other parity SSD(s) a command or instruction to pull parity information from the parity computation SSD, for example using a DMA operation, and then store the pulled parity information locally in the other parity SSD(s).

In another example, the main controller transfers data into a data SSD's buffer, sends a command or instruction to the parity computation SSD, which causes the parity computation SSD to pull the data from the buffer in the data SSD, for example using a DMA operation, and then update locally stored parity information using the received data. When writing data to the corresponding Redundancy Coding stripe is completed, the parity computed by the parity computation SSD is stored in the parity computation SSD. For implementations in which parity is stored in more than one parity computation SSD for each Redundancy Coding stripe, the parity computation SSD either pushes parity information to the other parity SSD(s), or sends the other parity SSD(s) a command or instruction to pull parity information from the parity computation SSD, for example using a DMA operation, and then store the pulled parity information locally in the other parity SSD(s).

In yet another example, the main controller transfers data into an intermediate buffer at or in bus interface 204, and either transfers that same data to a buffer in the data SSD, at which the data is to be stored, or tells the data SSD to pull the data from the intermediate buffer in bus interface 204. The main controller also sends an command or instruction to the parity computation SSD, which causes the parity computation SSD to pull the data from the intermediate buffer at or in bus interface 204, for example using a DMA operation, and then update locally stored parity information using the received data. When writing data to the corresponding Redundancy Coding stripe is completed, the parity computed by the parity computation SSD is stored in the parity computation SSD. For implementations in which parity is stored in more than one parity computation SSD for each Redundancy Coding stripe, the parity computation SSD either pushes parity information to the other parity SSD(s), or sends the other parity SSD(s) a command or instruction to pull parity information from the parity computation SSD, for example using a DMA operation, and then store the pulled parity information locally in the other parity SSD(s).

Reading, Recovering and Reconstructing Data

After data is written to a non-volatile memory system using method 700, that same data, or portions of the data, may be read in response to read requests received from one or more host systems. In the huge majority of cases, when a read request is processed (e.g., by host command processing module 220 of main controller 130), the storage device (s) storing the requested data are identified by the main controller, and the main controller sends one or more read commands to the identified storage device(s), which causes the data to be read and the data is returned to the requesting host system.

If the storage device identified as storing requested data is "not available," meaning that it is unable to return the requested data (e.g., because the storage device has failed, or the number of errors in the raw data read from the device is greater than the error correction power of the error correction information stored with the data), the main controller performs a data recovery operation, for example using data recovery module 660 (FIG. 2). The data recovery operation typically includes sending a read or data recovery command to a storage device in which parity information is stored for the stripe in which the requested data was stored. The read or data recovery command includes information identifying the stripe (e.g., Redundancy Coding stripe), and the location of the data to be recovered. That storage device then uses the parity information for the identified stripe to identify data to be read from other portions of the stripe and combined with the parity information (e.g., by XORing the parity information and identified data) so as to recover the unavailable data, and then return the recovered data to the requesting host device. In some embodiments, the recovered data is also stored to a new location in the non-volatile memory system, and mapping information for the stripe (e.g., including the stripe map for the stripe) is updated to reflect the new location of the recovered data.

In some embodiments, of systems (e.g., shown in FIG. 2B) that store both local parity and global parity information, the data recovery command is sent to and processed by the local parity SSD, identified by the main controller as the SSD having local parity information for (or corresponding to) the requested data. If the data recovery operation performed by the local parity SSD is successful, the recovered data is typically returned to the host device by the local parity SSD, acting on behalf of the SSD which failed to return the requested data. However, if the data recovery operation performed by the local parity SSD is unsuccessful (e.g., because two or more blocks or chunks of the identified stripe have failed), the main controller sends another data recovery command to the global parity SSD. The global parity SSD then performs a data recovery operation, by identifying and reading data from all the mini-stripes other than the mini-stripe from which the data was unable to be read, and combining global parity information stored in the global parity SSD with the data read from the other mini-stripes (e.g., by XORing the global parity information and the data read from the other mini-stripes) so as to recover the unavailable data, and then return that data to the requesting host device. In some embodiments, the recovered data is also stored to a new location in the non-volatile memory system, and mapping information for the stripe (e.g., including the stripe map for the stripe) is updated to reflect the new location of the recovered data.

In some embodiments, when an entire SSD fails and that condition is detected by the main controller or otherwise determined to have occurred, a data reconstruction operation is performed, for example by data recovery module 660. Data recovery module 660 identifies all the stripes that include data or parity information in the failed SSD (e.g., assigned to storage locations in the failed SSD), identifies an SSD for each such stripe to perform the reconstruction of the lost data, and sends a data reconstruction commands the identified SSD for each such stripe. Typically, the workload for reconstruction is spread across multiple data storage devices, thereby reducing the amount of time it takes to reconstruct the entire failed SSD, and also reducing interruption of service to the host devices.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of processing memory access in a non-volatile memory system having a main controller and a plurality of data storage devices, the method comprising:
    at the main controller, receiving, from a host device external to the non-volatile memory system, a write request to write specified data; and
    in response to receiving the write request, the main controller performing a sequence of operations, including:
        identifying a Redundancy Coding stripe in the plurality of data storage devices to which to write the specified data, the Redundancy Coding stripe including storage locations in a set of data storage devices comprising three or more of the plurality of data storage devices;
        identifying a first data storage device in the set of data storage devices to which to write the specified data, the identified data storage device including a controller, non-volatile memory and a data buffer;
        identifying a second data storage device in the set of data storage devices at which to compute and store parity for the identified Redundancy Coding stripe;
        initiating a data transfer of the specified data from a memory location in the host device, specified by the write request, to the second data storage device, thereby causing the specified data to be transferred to the second data storage device; and
        sending a parity computation command to the second data storage device to perform a parity computation on the specified data transferred to the second data storage device,
        wherein computed parity from the parity computation is initially stored in volatile memory in the second data storage device until all the specified data to be written to the identified Redundancy Coding stripe has been received by the second data storage device and included in the parity computation, after which the computed parity is stored in the non-volatile memory of the second data storage device.

2. The method of claim 1, wherein the sequence of operations further includes performing a multicast data transfer to concurrently transfer the specified data to both the first data storage device and the second data storage device.

3. The method of claim 2, wherein the sequence of operations further includes:
    allocating buffer space in the first data storage device to receive the specified data;
    allocating buffer space in the second data storage device to receive the specified data; and
    initiating execution of a remote direct memory access (RDMA) data transfer of the specified data from a memory location in the host device to the allocated buffer space in the first data storage device and to the allocated buffer space in the second data storage device.

4. The method of claim 1, further comprising:
    after completion of the data transfer of the specified data from the host device to the second data storage device:
        transmitting a copy of the specified data from the second data storage device to the first data storage device; and
        storing the specified data in storage locations of the first data storage device in the identified Redundancy Coding stripe.

5. The method of claim 1, wherein the sequence of operations further includes:
    allocating buffer space in the second data storage device to receive the specified data; and
    initiating execution of a remote direct memory access (RDMA) data transfer of the specified data from a memory location in the host device to the allocated buffer space in the second data storage device.

6. The method of claim 1, further comprising:
    generating at the second data storage device parity values for data stored in storage locations in the identified Redundancy Coding stripe that are located in a plurality of data storage devices of the set of data storage devices; and
    storing the generated parity values in storage locations in the identified Redundancy Coding stripe that are located in the second data storage device.

7. The method of claim 6, further comprising:
transmitting a copy of the generated parity values from the second data storage device to a third data storage device in the set of data storage devices; and
storing the generated parity values in storage locations in the identified Redundancy Coding stripe that are located in the third data storage device.

8. The method of claim 1, wherein the sequence of operations further includes sending a Redundancy Coding stripe map to the second data storage device, the Redundancy Coding stripe map indicating which data storage devices of the plurality of data storage devices are included in the set of data storage devices.

9. The method of claim 1, wherein the write request is a first write request, the specified data is first specified data, the host device is a first host device, the Redundancy Coding stripe is a first Redundancy Coding stripe and the set of data storage devices is a first set of data storage devices, the method further comprising,
receiving, from a second host device external to the non-volatile memory system, a second write request to write second specified data; and
in response to receiving the second write request, performing a second sequence of operations, including:
identifying a second Redundancy Coding stripe in the plurality of data storage devices to which to write the second specified data, the second Redundancy Coding stripe including storage locations in a second set of data storage devices comprising three of more of the plurality of data storage devices; wherein the second set of data storage devices at least partially overlaps the first set of data storage devices;
identifying a third data storage device in the second set of data storage devices to which to write the second specified data, the identified data storage device including a controller, non-volatile memory and a data buffer;
identifying a fourth data storage device in the set of data storage devices at which to compute and store parity for the second Redundancy Coding stripe;
initiating a data transfer of the second specified data from a memory location in the second host device, specified by the second write request, to the fourth data storage device, thereby causing the second specified data to be transferred to the fourth data storage device; and
sending a parity computation command to the fourth data storage device to perform a parity computation on the second specified data transferred to the fourth data storage device.

10. The method of claim 9, wherein the fourth data storage device is distinct from the second data storage device and is included in both the first set of data storage devices and the second set of data storage devices.

11. The method of claim 9, further comprising:
identifying the second data storage device in accordance with application of a mapping function to a logical address specified by the first write request; and
identifying the fourth data storage device in accordance with application of the mapping function to a logical address specified by the second write request.

12. The method of claim 11, further comprising:
identifying the first set of data storage devices in accordance with application of a mapping function to a logical address specified by the first write request; and
identifying the second set of data storage devices in accordance with application of the mapping function to a logical address specified by the second write request.

13. A memory controller, comprising:
a storage interface means for coupling the memory controller to a plurality of data storage devices;
a host interface means for receiving, from one or more host devices external to the memory controller, write requests and read requests, each write request comprising a request to write specified data from a respective host device to a respective data storage device, and each read request comprising a request to read requested data from a respective data storage device and convey the read data to a respective host device; and
a write command processing means for processing a respective write request from a respective host device by performing a sequence of operations, including:
identifying a Redundancy Coding stripe in the plurality of data storage devices to which to write the specified data, the Redundancy Coding stripe including storage locations in a set of data storage devices comprising three or more of the plurality of data storage devices;
identifying a first data storage device in the set of data storage devices to which to write the specified data, the identified data storage device including a controller, non-volatile memory and a data buffer;
identifying a second data storage device in the set of data storage devices at which to compute and store parity for the identified Redundancy Coding stripe;
initiating a data transfer of the specified data from a memory location in the host device, specified by the write request, to the second data storage device, thereby causing the specified data to be transferred to the second data storage device; and
sending a parity computation command to the second data storage device to perform a parity computation on the specified data transferred to the second data storage device,
wherein computed parity from the parity computation is initially stored in volatile memory in the second data storage device until all the specified data to be written to the identified Redundancy Coding stripe has been received by the second data storage device and included in the parity computation, after which the computed parity is stored in the non-volatile memory of the second data storage device.

14. The memory controller of claim 13, wherein each data storage device of the plurality of data storage devices in the non-volatile memory system includes:
non-volatile memory for durably storing information;
one or more data buffers for temporarily storing information being written to or read from the non-volatile memory of the data storage device; and
an SSD controller for controlling operation of the data storage device, including execution of read and write commands.

15. The memory controller of claim 14, wherein:
the non-volatile memory of each data storage device of the plurality of data storage devices comprises flash memory; and
the one or more data buffers of each data storage device of the plurality of data storage devices comprises non-volatile RAM.

16. The memory controller of claim 13, wherein the sequence of operations further includes performing a multicast data transfer to concurrently transfer the specified data to both the first data storage device and the second data storage device.

17. The memory controller of claim 16, wherein the sequence of operations further includes:
   allocating buffer space in the first data storage device to receive the specified data;
   allocating buffer space in the second data storage device to receive the specified data; and
   initiating execution of a remote direct memory access (RDMA) data transfer of the specified data from a memory location in the host device to the allocated buffer space in the first data storage device and to the allocated buffer space in the second data storage device.

18. The memory controller of claim 13, wherein the sequence of operations further includes, after completion of the data transfer of the specified data from the host device to the second data storage device:
   transmitting a copy of the specified data from the second data storage device to the first data storage device; and
   storing the specified data in storage locations of the first data storage device in the identified Redundancy Coding stripe.

19. The memory controller of claim 13, wherein the sequence of operations further includes:
   generating at the second data storage device parity values for data stored in storage locations in the identified Redundancy Coding stripe that are located in a plurality of data storage devices of the set of data storage devices; and
   storing the generated parity values in storage locations in the identified Redundancy Coding stripe that are located in the second data storage device.

20. A non-transitory computer readable storage medium storing one or more programs configured for execution by a memory controller configured to be coupled to one or more host devices and a plurality of data storage devices, the one or more programs comprising instructions that when executed by one or more processors of the memory controller, cause the memory controller to:
   receive, from the one or more host devices external to the memory controller, write requests and read requests, each write request comprising a request to write specified data from a respective host device to a respective data storage device, and each read request comprising a request to read requested data from a respective data storage device and convey the read data to a respective host device; and
   process a respective write request from a respective host device by performing a sequence of operations, including:
      identifying a Redundancy Coding stripe in the plurality of data storage devices to which to write the specified data, the Redundancy Coding stripe including storage locations in a set of data storage devices comprising three or more of the plurality of data storage devices;
      identifying a first data storage device in the set of data storage devices to which to write the specified data, the identified data storage device including a controller, non-volatile memory and a data buffer;
      identifying a second data storage device in the set of data storage devices at which to compute and store parity for the identified Redundancy Coding stripe;
      initiating a data transfer of the specified data from a memory location in the host device, specified by the write request, to the second data storage device, thereby causing the specified data to be transferred to the second data storage device; and
      sending a parity computation command to the second data storage device to perform a parity computation on the specified data transferred to the second data storage device,
      wherein computed parity from the parity computation is initially stored in volatile memory in the second data storage device until all the specified data to be written to the identified Redundancy Coding stripe has been received by the second data storage device and included in the parity computation, after which the computed parity is stored in the non-volatile memory of the second data storage device.

* * * * *